United States Patent
Nishimura et al.

(10) Patent No.: US 9,234,083 B2
(45) Date of Patent: Jan. 12, 2016

(54) METHOD AND APPARATUS FOR FORMING A PERIODIC PATTERN USING A SELF-ASSEMBLED BLOCK COPOLYMER

(71) Applicant: Tokyo Electron Limited, Tokyo (JP)

(72) Inventors: Eiichi Nishimura, Miyagi (JP); Fumiko Yamashita, Miyagi (JP); Satoko Niitsuma, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/384,725

(22) PCT Filed: Mar. 21, 2013

(86) PCT No.: PCT/JP2013/058100
§ 371 (c)(1),
(2) Date: Sep. 12, 2014

(87) PCT Pub. No.: WO2013/146538
PCT Pub. Date: Oct. 3, 2013

(65) Prior Publication Data
US 2015/0048049 A1    Feb. 19, 2015

Related U.S. Application Data

(60) Provisional application No. 61/620,513, filed on Apr. 5, 2012.

(30) Foreign Application Priority Data

Mar. 28, 2012 (JP) .................................. 2012-074540

(51) Int. Cl.
C08J 7/12 (2006.01)
H01L 21/033 (2006.01)
H01L 21/027 (2006.01)
H01L 21/311 (2006.01)
B82Y 30/00 (2011.01)
B81C 1/00 (2006.01)
H01J 37/32 (2006.01)

(52) U.S. Cl.
CPC ............ *C08J 7/123* (2013.01); *B81C 1/00031* (2013.01); *B82Y 30/00* (2013.01); *H01J 37/32366* (2013.01); *H01J 37/32651* (2013.01); *H01L 21/0271* (2013.01); *H01L 21/0273* (2013.01); *H01L 21/0332* (2013.01); *H01L 21/0337* (2013.01); *H01L 21/31127* (2013.01); *H01L 21/31133* (2013.01); *H01L 21/31138* (2013.01); *B81C 2201/0149* (2013.01); *C08J 2353/00* (2013.01); *H01J 2237/334* (2013.01)

(58) Field of Classification Search
None
See application file for complete search history.

(56) References Cited

U.S. PATENT DOCUMENTS

| 7,521,094 | B1* | 4/2009 | Cheng | B82Y 10/00 427/385.5 |
| 2014/0131839 | A1* | 5/2014 | Chan | G03F 7/0002 257/618 |
| 2014/0357083 | A1* | 12/2014 | Ling | H01L 21/31138 438/694 |

FOREIGN PATENT DOCUMENTS

| JP | 2007-208255 | 8/2007 |
| JP | 2010-269304 | 12/2010 |

*Primary Examiner* — Duy Deo
(74) *Attorney, Agent, or Firm* — IPUSA, PLLC

(57) ABSTRACT

A method for causing a first polymer and a second polymer of a block copolymer to be self-assembled on an underlayer film and forming a periodic pattern in a guide layer is provided. The method includes a first etching process of etching the second polymer by plasma generated from a first gas, a first film deposition process of depositing a first protective film on surfaces of the first polymer and the guide layer except for an etched portion of the second polymer by plasma generated from a second gas after the first etching process, and a second etching process of further etching the second polymer by the plasma generated from the first gas after the first film deposition process.

13 Claims, 23 Drawing Sheets

FIG.2
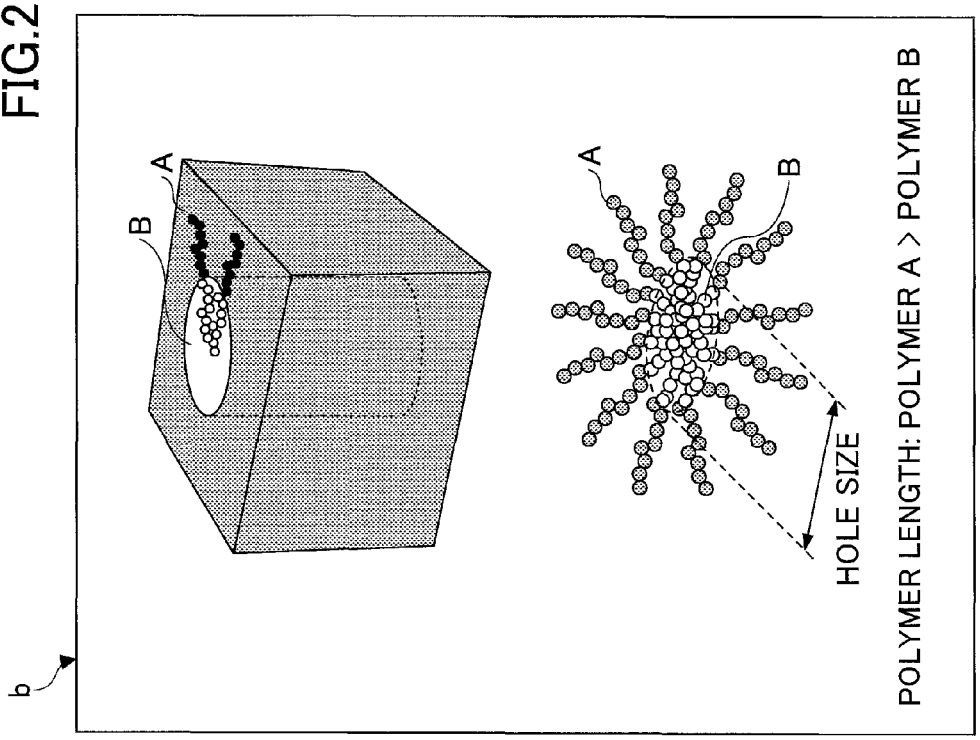
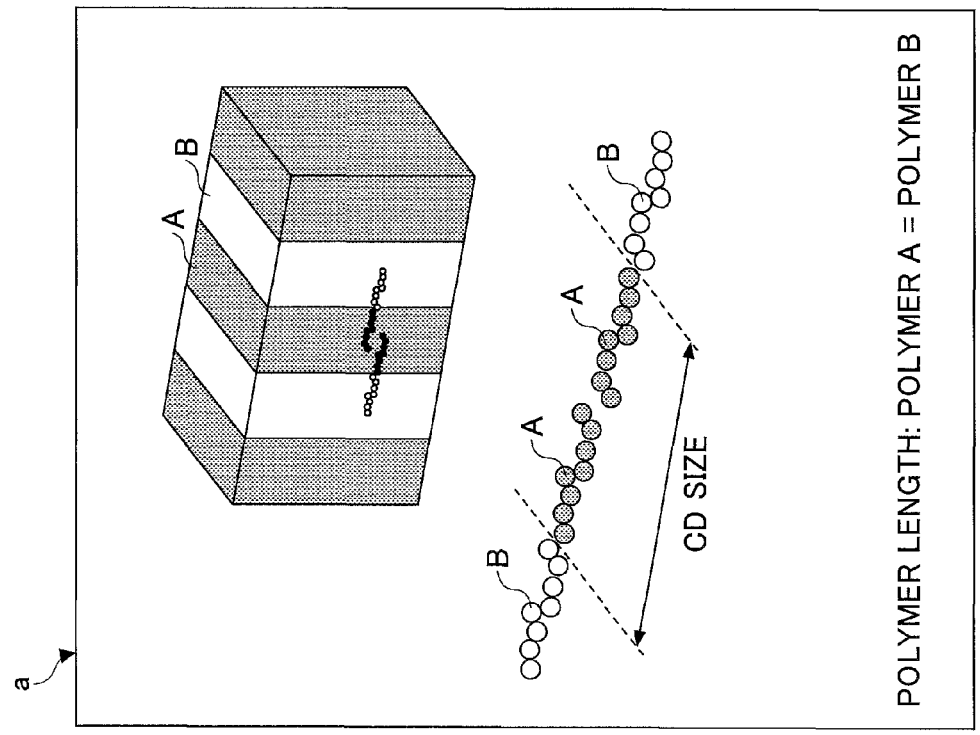

$$L_0 \cong a\chi^{1/6} N^{2/3} \quad \cdots (1)$$

$a$ : AVARAGE SIZE OF MONOMER (DIAMETER)
$\chi$ : MAGNITUDE OF INTERACTION
$N$ : POLYMERIZATION DEGREE OF POLYMER Ex. $N = 7$

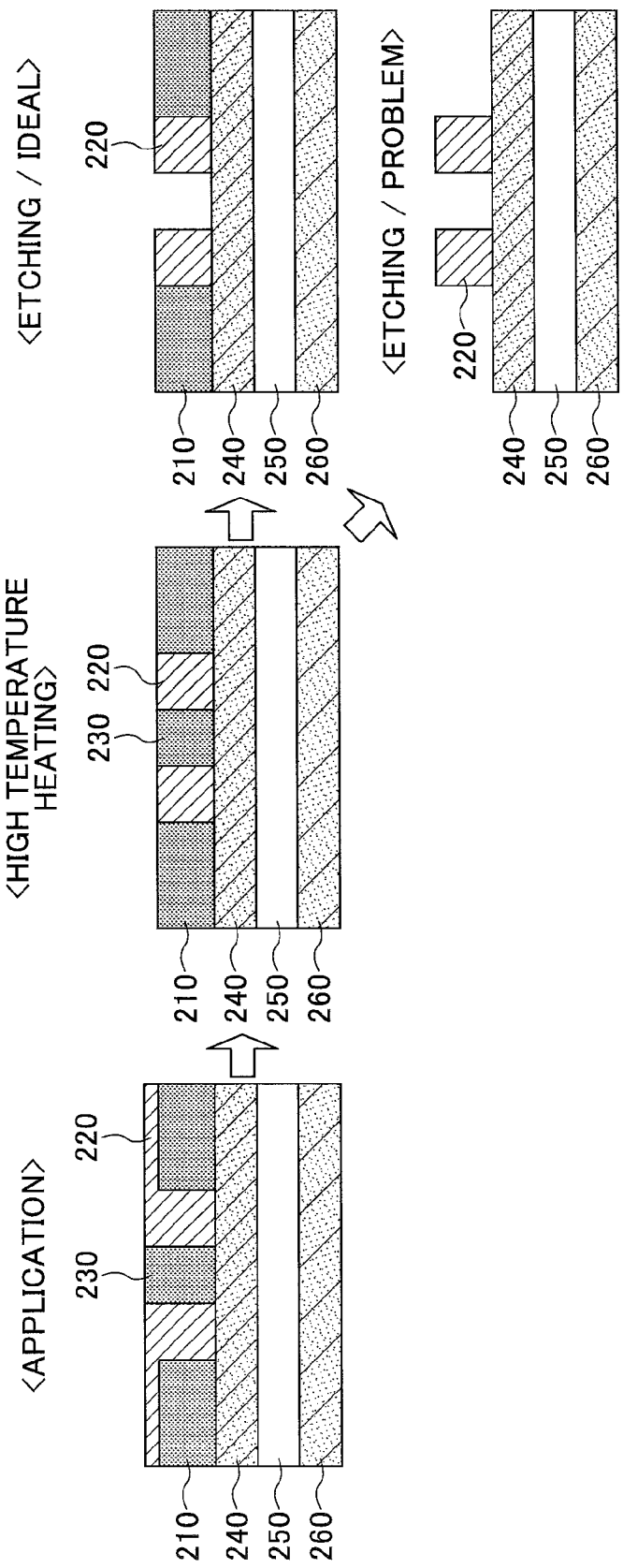

METHOD AND APPARATUS FOR FORMING A PERIODIC PATTERN USING A SELF-ASSEMBLED BLOCK COPOLYMER

CROSS-REFERENCE TO RELATED APPLICATIONS

The present application is a National Stage of International Application No. PCT/JP2013/058100 filed on Mar. 21, 2013, claiming priority based on Japanese Patent Application No. 2012-074540 filed on Mar. 28, 2012, and U.S. Provisional Application No. 61/620,513 filed on Apr. 5, 2012, the entire contents of which are hereby incorporated by reference.

TECHNICAL FIELD

The present invention relates to a method and an apparatus for forming a periodic pattern using a block copolymer capable of self-assembly.

BACKGROUND ART

In order to achieve further miniaturization of semiconductor devices, a critical dimension of the devices has to be more downsized than that achieved by the existing micro fabrication process using lithography technology. To achieve this, EUV (Extreme Ultraviolet) lithography, a next generation lithography technology, has been developed. In the EUV lithography, a very short wavelength of a light source, for example, 13.5 nm, is used. Because of this, in EUV lithography, there are technological obstacles for mass production due to an extremely shorter wavelength of a light source than in a conventional UV light source, for example, problems of a long lithography time period and the like. Accordingly, development of a method for manufacturing a more miniaturized device has been desired without waiting for the advancement in the development of the next generation lithography technology of EUV lithography technology.

Therefore, Patent Document 1 focuses on a self-assembled block copolymer (BCP: block copolymer), which is one of many self-assembled materials that spontaneously organize an ordered pattern internally. More specifically, a block copolymer layer containing at least two polymer block components A and B that do not mix with each other is applied to an underlayer film. After that, the polymer block components A and B spontaneously separate in phase from each other by being annealed. An ordered pattern constituted of nano-size structure units obtained from this process is effective to provide a further miniaturized device.

Patent Document 2 proposes a patterning process of the block copolymer as a method for forming a via-hole having a proper and uniform critical dimension (CD: Critical Dimension) and a narrower pitch.

The dimension of the structure unit formed by patterning the block copolymer is within a scope of 10 nm, which is difficult to be implemented by the conventional lithography technology.

Furthermore, the structure unit formed by the block copolymer adjusts to conventional semiconductor, optical and magnetic processes, and therefore can be incorporated into semiconductor, optical and magnetic devices.

PRIOR ART DOCUMENTS

Patent Documents

Patent Document 1: Japanese Laid-Open Patent Application Publication No. 2007-208255
Patent Document 1: Japanese Laid-Open Patent Application Publication No. 2010-269304

SUMMARY OF THE INVENTION

Problem to be Solved by the Invention

However, Patent Documents 1 and 2 do not disclose adjusting process conditions in forming a periodic pattern by etching either the polymer block component A or B. In the meanwhile, when etching a periodic pattern formed by applying a polystyrene PS (hereinafter "PS") as the polymer block components A and B and a methyl methacrylate PMMA (hereinafter "PMMA"), because an ArF photoresist film having a wavelength of 193 nm that functions as a guide layer and the PMMA have almost the same structure to each other in composition of major portions thereof, a selective ratio of the PMMA to the ArF photoresist film cannot be selected, and the ArF photoresist film is etched when etching the PMMA at the approximately-same etching rate to each other. Hence, because an amount of remaining ArF photoresist film is not enough after etching the PMMA, it is difficult for the ArF photoresist film to function as a mask for etching an underlayer film.

In response to the above problems, an embodiment of the present invention aims at etching a periodic pattern while depositing a protective film by using a block copolymer capable of self-assembly.

Means for Solving the Problem

To solve the above discussed problems, according to one embodiment of the present invention, there is provided a method for causing a first polymer and a second polymer of a block copolymer to be self-assembled on an underlayer film and forming a periodic pattern in a guide layer. The method includes a first etching step of etching the second polymer by plasma generated from a first gas, a first film deposition process of depositing a first protective film on surfaces of the first polymer and the guide layer except for an etched portion of the second polymer by plasma generated from a second gas after the first etching process, and a second etching process of further etching the second polymer by the plasma generated from the first gas after the first film deposition process.

According to another embodiment of the present invention, there is provided an apparatus for causing a first polymer and a second polymer of a block copolymer to be self-assembled on an underlayer film and forming a periodic pattern in a guide layer. The apparatus includes a gas supply source configured to introduce a gas into a chamber, and a control unit configured to control a first etching process of etching the second polymer by plasma generated from a first gas, a first film deposition process of depositing a first protective film on surfaces of the first polymer and the guide layer except for an etched portion of the second polymer by plasma generated from a second gas after the first etching process, and a second etching process of further etching the second polymer by the plasma generated from the first gas after the first film deposition process.

Advantageous Effect of the Invention

According to an embodiment of the present invention, a periodic pattern can be etched while depositing a protective film by using a self-assembled block copolymer.

BRIEF DESCRIPTION OF THE DRAWINGS

FIGS. 2a and 2b are diagrams for explaining application of a phase-separated structure of the PS and the PMMA to a semiconductor pattern;

FIG. 5A is a diagram for explaining a problem to be solved by the first and second embodiments;

EMBODIMENTS FOR IMPLEMENTING THE INVENTION

Figure 1:
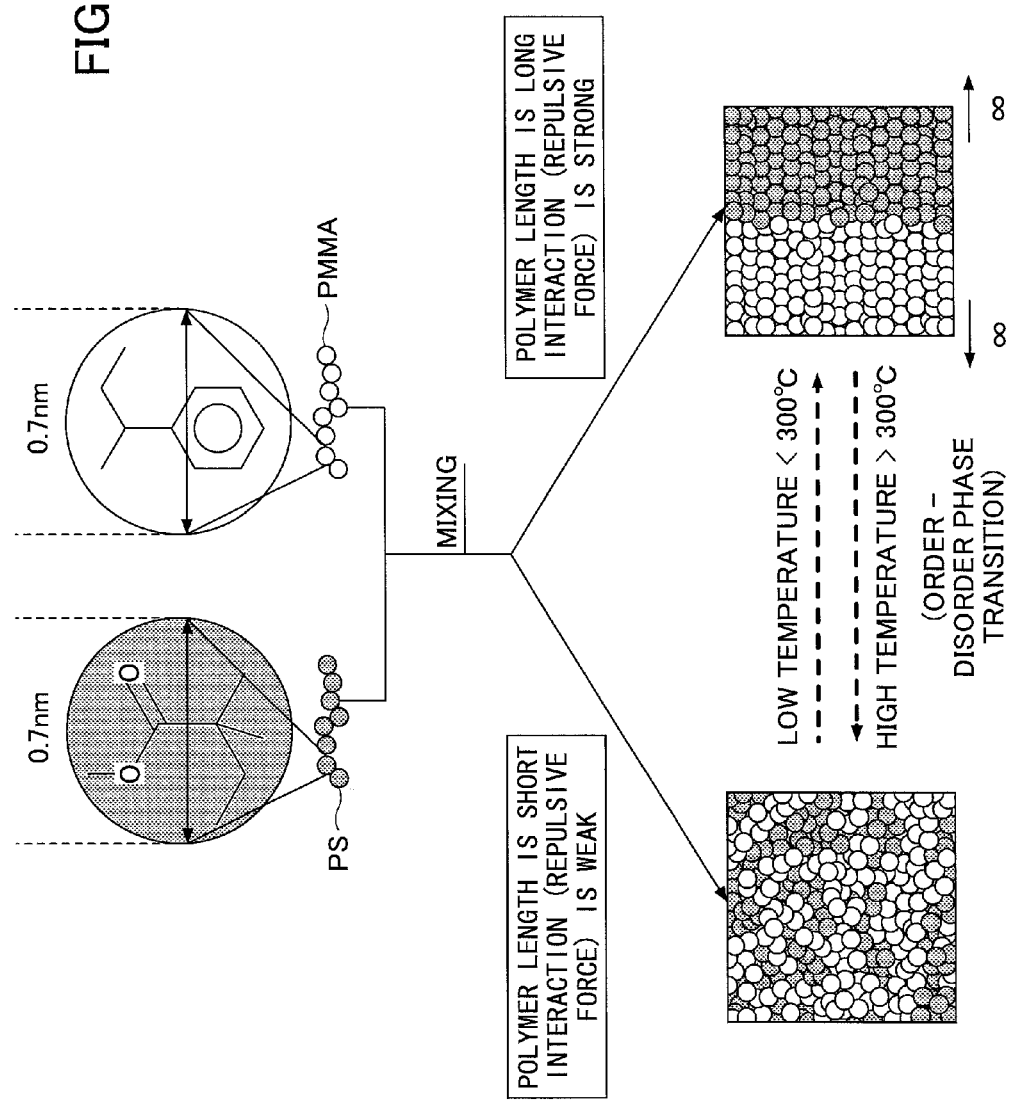
FIG. 1 is a diagram for explaining self-assembly of PS and PMMA.

In the following, embodiments of the present invention are described with reference to the accompanying drawings. Note that elements having substantially the same functions or features may be given the same reference numerals and overlapping descriptions thereof may be omitted.

<In the Beginning>

[Self-Assembled Block Copolymer]

To begin with, a description is given below of a self-assembled block copolymer before describing a specific etching process in forming a pattern by using polystyrene as a first polymer and methyl methacrylate as a second polymer.

A directed self-assembly technology (DSA: directed self-assembly) forms a self-assembled periodic pattern by causing the first copolymer and the second copolymer of the block copolymer to be self-assembled on an undelayer film. According to this, a finer pattern can be formed than that formed by the present lithography, and by using the fine pattern as an etching pattern, a microfabrication finer than the critical dimension of the semiconductor devices using the present photolithography can be realized.

At first, a description is given below of a self-assembly of the block copolymer with reference to FIG. 1. The PS and the PMMA are both macromolecules having a diameter of 0.7 nm of one macromolecule.

A block copolymer layer containing the PS and the PMMA that do not mix with each other is applied to an underlayer film. In this state, the block copolymer layer is annealed at a temperature in a range from room temperature (25 degrees C.) to 300 degrees C. In general, when treated with heat in a range of 200 to 250 degrees C., the block copolymer layer undergoes phase separation. However, when treated with heat at a temperature that is higher than 300 degrees C., the block copolymer does not undergo the phase separation and the PS and the PMMA are arranged randomly. Moreover, the block copolymer layer keeps a phase-separated state even if the temperature is returned to room temperature after the phase separation.

Interaction (repulsive force) becomes weak and a hydrophilic property becomes strong when a polymer length of each polymer is short. Interaction (repulsive force) becomes strong and a hydrophobic property becomes strong when the polymer length of each polymer is long. By using such properties of the polymer, for example, as illustrated in FIG. 2a and FIG. 2b, the phase separation structure of the PS and the PMMS can be applied to a semiconductor pattern. FIG. 2a illustrates a phase separation structure when the polymer A and the polymer B have almost the same polymer length (A=B). According to this, because the interaction of each polymer is the same, when the block copolymer is treated with heat at a temperature of about 250 degrees C., the polymer A and the polymer B are self-assembled and undergo the phase separation in a line form. This phase separation structure can be applied to a semiconductor fabrication pattern as a periodic pattern of a line and space (L/S).

Furthermore, FIG. 2b illustrates a phase separation structure when polymer lengths of the polymer A and the polymer B are greatly different from each other (A>B). According to this, the interaction (repulsive force) of the polymer A is strong, and the interaction (repulsive force) of the polymer B is weak. Due to such strength and weakness of the interaction between the polymers, when the block copolymer layer is treated with heat at a temperature of about 250 degrees, the polymer A is self-assembled on the outer side and the polymer B is self-assembled on the inner side, which are phase-separated so as to form into a hole shape. This phase separation structure can be applied to a semiconductor fabrication pattern as a periodic pattern of holes.

As described above, a line and space pattern is formed when the self-assembled periodic pattern of the block copolymer is aligned on a line in a predetermined direction, and a hole pattern is formed when one polymer component is arranged to surround the other polymer component. There are many structures in the phase separation structure of the block copolymer other than the line shape and the hole shape, but two of the above structures are preferred to be used as a semiconductor pattern.

[Mask Formation Made of Self-Assembled Block Copolymer]

Next, a description is given below of a process of forming a mask made of the above-described self-assembled block copolymer with reference to steps S1 through S7 in FIG. 3.

Figure 3:
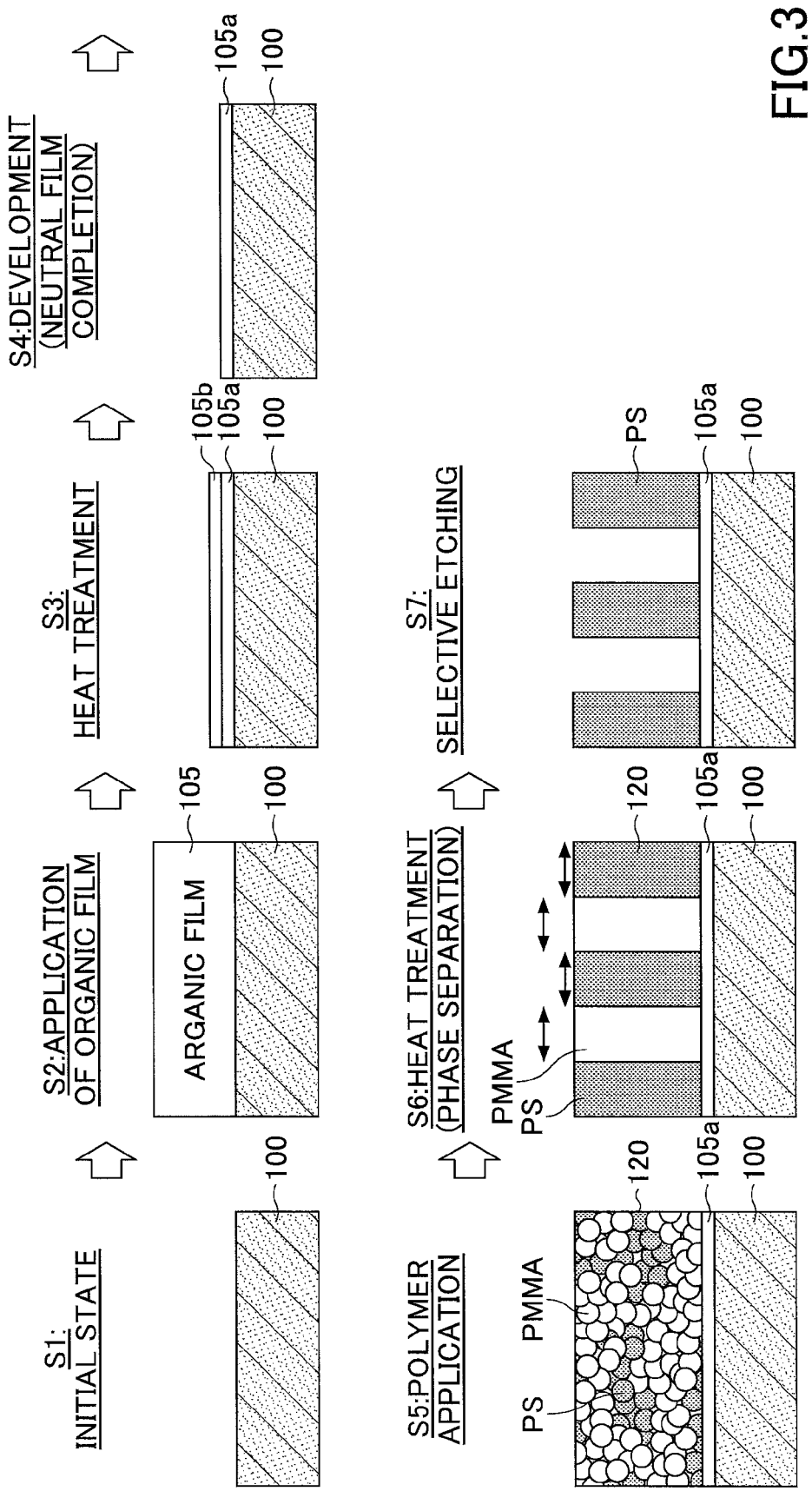
FIG. 3 is a diagram for explaining a process of selectively etching one polymer of the block copolymer.

To begin with, an organic film 105 illustrated in step S2 in FIG. 3 is applied to the top of an underlayer film 100 in an initial state of step S1 in FIG. 3. The underlayer film 100 is made of silicon Si, silicon oxide SiO, an organic film (an amorphous carbon film, an organic SOG film) or the like.

After the application, a heat treatment is performed as illustrated in step S3 in FIG. 3. Although a proper value of a heating temperature depends on a kind of the organic film, the proper value of the heating temperature is usually about from 200 to 300 degrees C. Here, for example, the heat treatment is performed at 250 degrees C. After the heat treatment, the organic film 105 shrinks as a whole (105a, 105b), and a surface thereof becomes an altered layer 105b that is an alteration of a carbon component.

In this state, by chemically removing the altered layer 105b as illustrated in step S4 in FIG. 3, a neutral film 105a that makes a surface neutral, which is neither hydrophobic nor hydrophilic, is completed. As described above, the hydrophilic property becomes strong when the polymer length is short, and the hydrophobic property becomes strong when the polymer length is long. In this manner, because the polymer includes a type having a strong hydrophilic property and a type having a strong hydrophobic property, the surface is made neutral so that the polymer is phase-separated so as to form a desired shape.

Next, as illustrated on step S5 in FIG. 3, a polymer layer 120 is applied to the top of the neutral film 105a. At this time, the applied polymer layer 120 contains the PS as the first polymer and the PMMA as the second polymer. Phase separation is possible with or without a guide. The state of the phase separation of the polymer to be applied can be controlled by utilizing the hydrophobic or hydrophilic properties of the guide or the underlayer film. After the application, as illustrated in step S6 in FIG. 3, when the polymer layer 120 is treated with heat at a temperature of 250 degrees C., the polymer layer 120 is phase-separated into the PS and the PMMA. The diameter of CD (Critical Dimension) of the semiconductor devices is determined by the self-assembly.

Finally, as illustrated in step S7 in FIG. 3, the self-assembled and phase-separated PS and PMMA are selectively etched, and a pattern of the PS is formed by removing the PMMA.

[Pattern Cycle and Error of Self-Assembled Block Copolymer]

Figure 4:
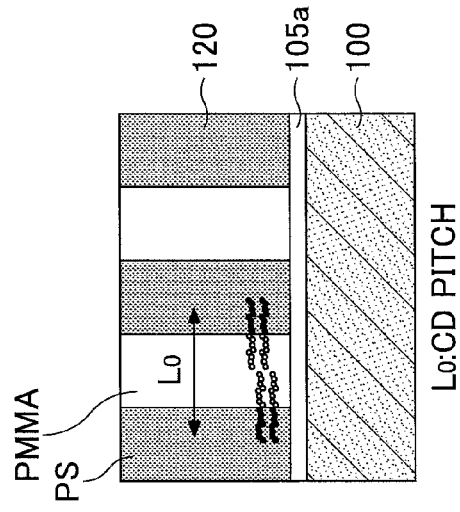
FIG. 4 is a diagram for explaining a cycle of the phase-separated structure.

A pattern cycle $L_0$ of the self-assembly of the block copolymer is expressed by a formula (1) in FIG. 4.

$$L_0 = a\chi^{1/6} N^{2/3} \quad (1)$$

Here, "a" is an average size (diameter) of a monomer; "$\chi$" is a magnitude of interaction of the polymer; and "N" is a polymerization degree of the polymer.

According to this, the pattern cycle $L_0$ of the self-assembly is a value in which a molecular size of the block copolymer is involved, and a pattern having a finer dimension than the critical dimension of the semiconductor devices implementable by the microfabrication method using the conventional photolithography technology can be formed.

Thus, the dimension of the structure unit is normally within a range of 10 nanometers which is difficult for the conventional photolithography technology to implement, due to the pattern cycle $L_0$ of the self-assembly of the block copolymer. In addition, the block copolymer conforms to the conventional semiconductor, optical and magnetic processes. Hence, the structure unit made of the block copolymer can be readily incorporated into a semiconductor, optical and magnetic devices.

First Embodiment

[PS/PMMA]

In a first embodiment of the present invention, a PMMA 230 and a PS 220 are used as the polymer block components A and B. More specifically, as illustrated in FIG. 5A, a carbon layer 250 is deposited on a silicon (Si) substrate 260, and a silicon (Si)—organic antireflection film (ARC) 240 is deposited thereon as an underlayer film. The PMMA 230 and the PS 220 are applied to the underlayer film in a state of a guide layer 210 provided on the underlayer film. As described above, the PMMA 230 and the PS 220 are self-assembled by being heated at a high temperature after being applied. A periodic pattern is formed by etching the self-assembled PMMA 230. This is an ideal etching process.

In contrast, under present circumstances, there are problems in which a selective ratio of the PMMA to the guide layer 210 cannot be taken when etched, and the guide layer 210 is thinned or removed.

Figure 5B:
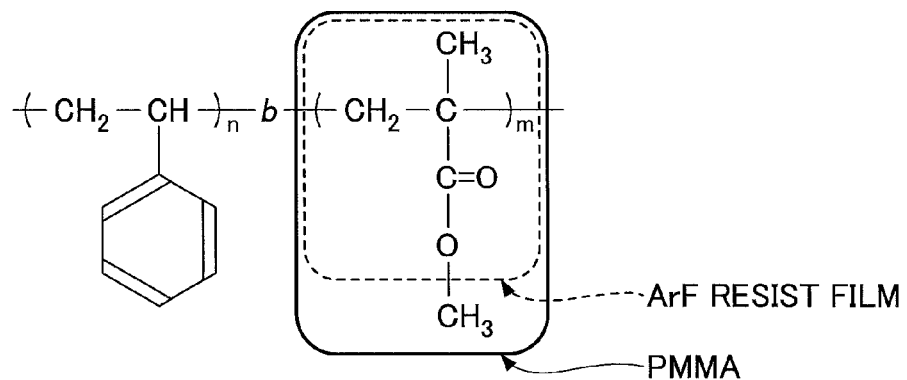
FIG. 5B is a diagram for explaining the problem to be solved by the first and second embodiments.

Under these circumstances, an ArF photoresist having a wavelength of 193 nm or a KrF photoresist film having a wavelength of 248 nm is used as a photoresist film that functions as the guide layer 210. In the meantime, as illustrated in FIG. 5B, because the PMMA and the ArF photoresist film have almost the same structure in composition of major portions thereof, the selective ratio of the PMMA to the ArF photoresist film cannot be taken, and the ArF photoresist film is etched at approximately the same etching rate as that of the PMMA. Accordingly, the ArF photoresist film cannot function as a mask for etching the underlayer film.

[Etching Process]

Figure 6:
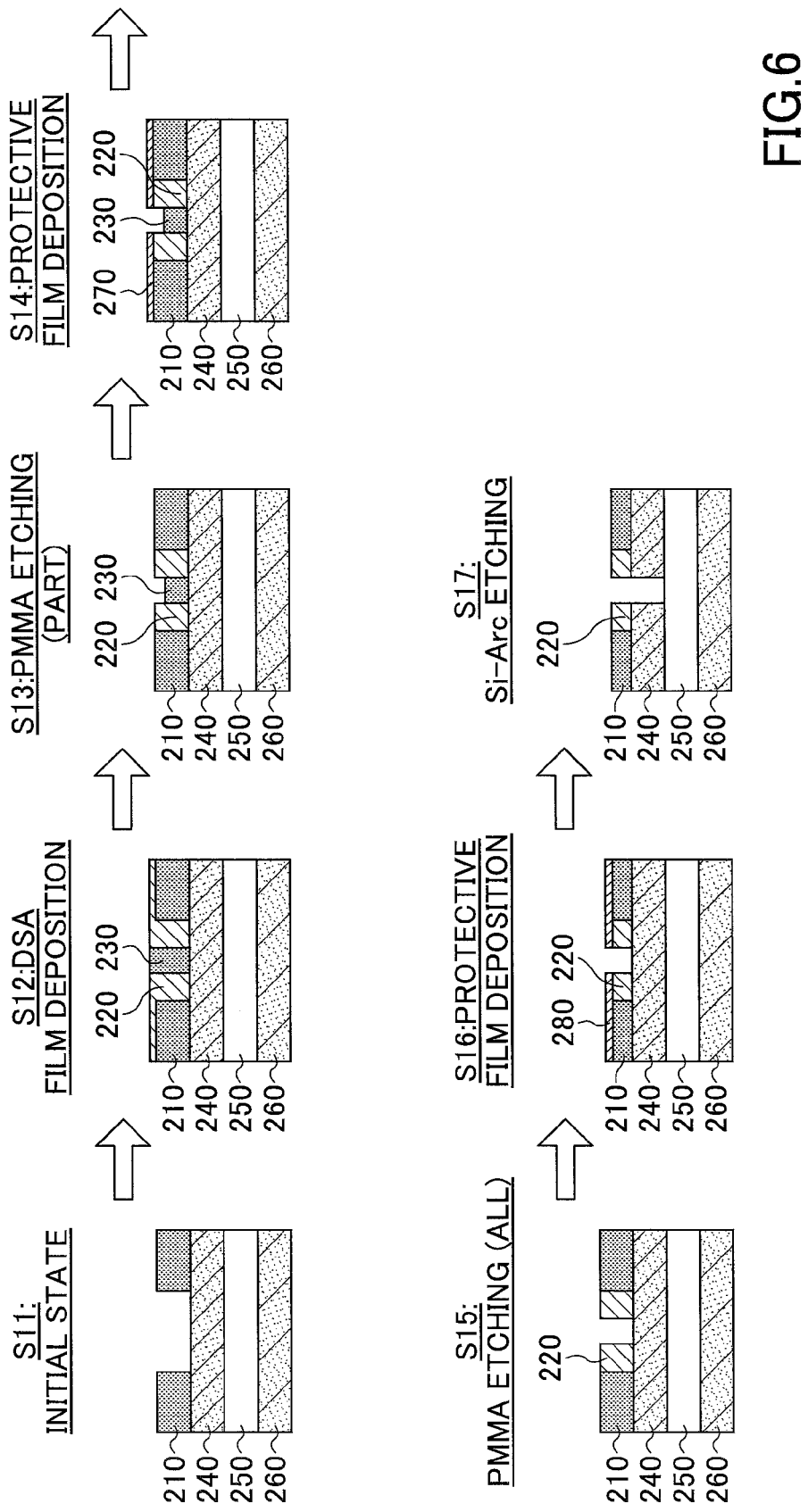
FIG. 6 is a diagram illustrating an etching process according to the first embodiment.

Therefore, in the etching process according to the embodiment, in forming the periodic pattern by using the PMMA 230 and the PS 220, the periodic pattern is etched while depositing a protective film. A description is given below of the etching process according to the embodiment with reference to FIG. 6. Steps S11 through S17 in FIG. 6 are diagrams illustrating an example of the etching process according to the first embodiment.

(Step S11: Initial State)

In an initial state, a carbon layer 250 and a Si-Arc layer 240 are deposited on a silicon (Si) substrate 260, and a guide layer 210 is provided thereon. A predetermined pattern is formed in the guide layer 210. A silicon oxide (SiO) is taken as an example of the Si-Arc layer 240.

(Step S12: DSA Process)

After the PMMA 230 and the PS 220 are applied to the layers of the above initial state, the PMMA 230 and the PS 220 are self-assembled by being heated. By depositing a DSA in this manner, a hole-shaped pattern having a predetermined cycle is formed in the guide layer 210.

(Step S13: PMMA Etching (Part)—First Etching Process—)

Subsequently, a part of the PMMA 230 is etched. This process corresponds to a first etching process that etches the PMMA 230 by plasma generated from a first gas. This causes a depression to be formed in an exposed part of the PMMA 230.

Here, process conditions of this process are as follows.
Pressure: 75 (mTorr) (=9999.15 Pa)
High Frequency Power: HF for Plasma Generation 100 (W)/ LF for Bias 0 (W)
First Gas: $O_2/Ar=50/850$ (sccm)
Process Time: 10 (seconds)
The first gas also may be as follows.
First Gas: $O_2/Ar/CO=40/850/10$ (sccm)
The first gas contains at least an $O_2$ gas and an Ar gas.

(Step S14: Protective Film Deposition—First Film Deposition)

Next, a first protective film 270 is deposited on a surface of the PS 220 and the guide layer 210 except for the exposed depression portion of the PMMA 230. This process corresponds to a first film deposition process that deposits the first protective film on the surfaces of the PS 220 and the guide layer 210 except for the etched portion of the PMMA 230 by plasma generated from a second gas. Here, process conditions of the process are as follows.
Pressure: 10 (mTorr) (=1333.22 Pa)
High Frequency Power: HF for Plasma Generation 500 (W)/ LF for Bias 0 (W)
Second Gas: $SiCl_4/O_2/He=25/25/200$ (sccm)
Process Time: 10 (seconds)

(Step S15: PMMA Etching (All)—Second Etching Process—)

Next, all of the PMMA 230 is etched. At this time, the first protective film 270 protects the PS 220 and the guide layer 210 from the etching of this process. This process corresponds to a second etching process that further etches the second polymer.

Here, since process conditions of this process are the same as those in the first etching process, the description is omitted here.

(Step S16: Protective Film Deposition—Second Film Deposition—)

Next, a second protective film 280 is deposited on a surface of the PS 220 and the guide layer 210. Here, the second protective film 280 is deposited before etching the Si-Arc layer 240 in FIG. 6, but may be deposited in the middle of etching the Si-Arc layer 240. This process corresponds to a second film deposition process that deposits the second protective film 280 on the surface of the PS 220 and the guide layer 210 by plasma generated from a fourth gas before an etching process of the Si-Arc layer 240 or in the middle of the etching process of the Si-Arc layer 240 described later.

Here, process conditions of this process are as follows.
Pressure: 10 (mTorr) (=1333.22 Pa)
High Frequency Power: HF for Plasma Generation 500 (W)/ LF for Bias 0 (W)
Fourth Gas: $SiF_4/SiCl_4/He=5/20/200$ (sccm)
Process Time: 10 (seconds)

(Step S17: Si-Arc Etching—Third Etching Process—)

After the PMMA etching, the Si-Arc layer 240 is etched. At this time, the second protective layer 280 protects the PS 220 and the guide layer 210 from the etching of this process. This process corresponds to a third etching process that etches the Si-Arc of the underlayer film by plasma generated from a third gas after the second etching process.

Here, process conditions of this process are as follows.
Pressure: 20 (mTorr) (=2666.44 Pa)
High Frequency Power: HF for Plasma Generation 150 (W)/ LF for Bias 50 (W)
Third Gas: $CHF_3/CF_4/O_2=100/200/5$ (sccm)
Process Time: 50 (seconds)

As described above, according to the etching method of the embodiments, a periodic pattern can be etched while depositing a protective film by using a self-assembled block copolymer.

[Overall Configuration of Apparatus]

Figure 7:
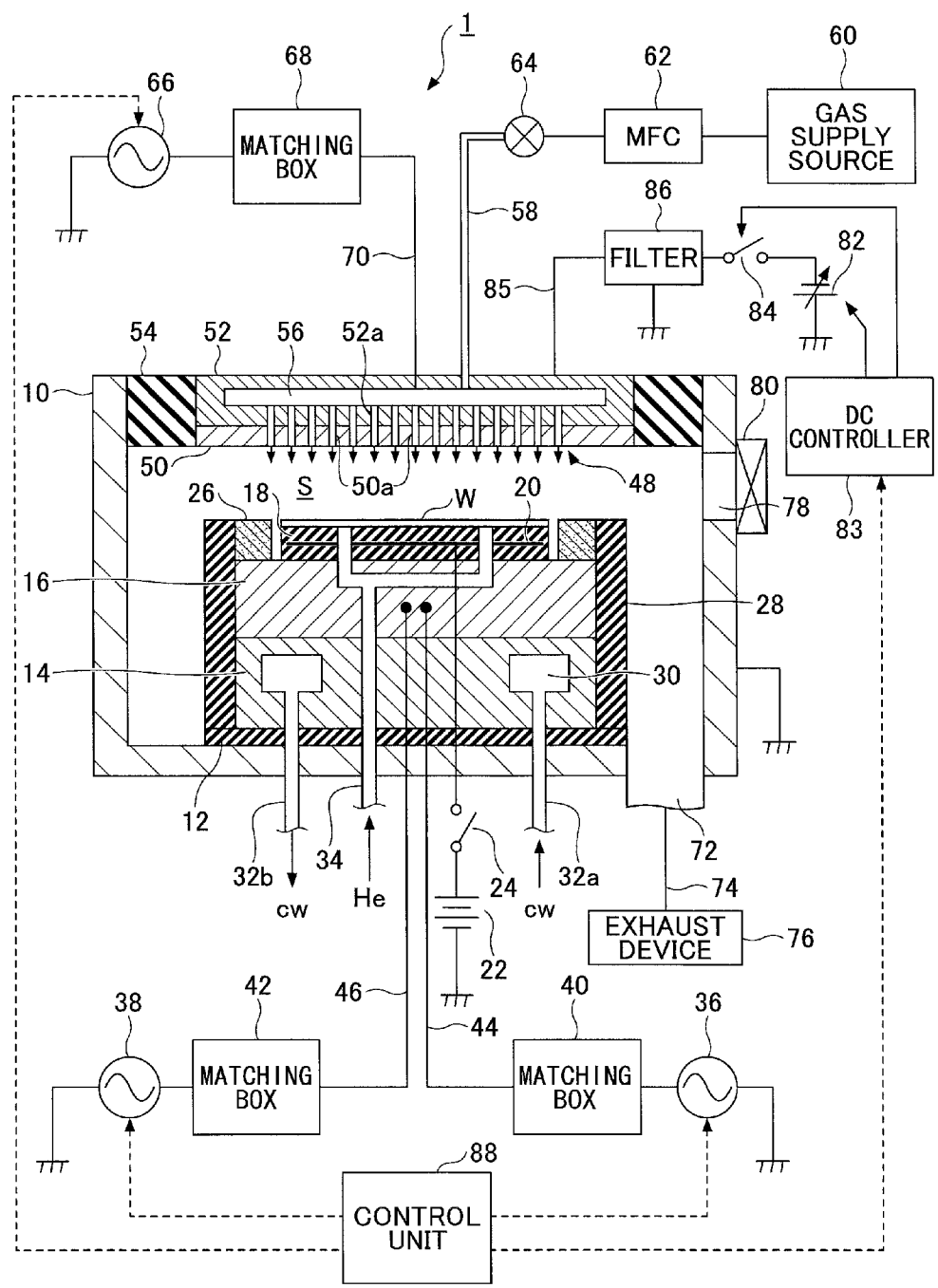
FIG. 7 is a vertical cross-sectional view illustrating an overall structure of a plasma processing apparatus according to the first and second embodiments.

Next, a description is given below of an overall configuration of a plasma processing apparatus that implements the etching process and the film deposition process described above with reference to FIG. 7. FIG. 7 illustrates the overall configuration of the plasma processing apparatus in the first and second embodiments. The plasma processing apparatus 1 is configured to be a lower-part-dual-frequency and upper-part-single-frequency application type capacitively-coupled plasma etching apparatus, and for example, includes a cylindrical vacuum chamber (processing chamber) 10 made of aluminum having a surface that is subjected to alumite treatment (anodic oxidation). The chamber 10 is grounded.

A columnar susceptor support 14 is arranged on a bottom surface of the chamber 10 through an insulating plate 12 made of ceramics or the like, and a susceptor 16, for example, made of aluminum, is provided on the susceptor support 14. The susceptor 16 constitutes a lower electrode, and an object to be processed, for example, a semiconductor wafer W (which is hereinafter called a wafer W), is placed thereon.

An electrostatic cuck 18 is provided on an upper surface of the susceptor 16 to hold the wafer W by electrostatic adsorption power. The electrostatic chuck 18 is configured to insert a chuck electrode 20 made of a conductive film between a pair of insulating layers or insulating sheets, and a direct-current power source 22 is electrically connected to the electrode 20 through a switch 24. The electrostatic chuck 18 is configured to adsorb and hold the wafer W by the electrostatic power thereon by a direct voltage from the direct-current power source 22. A focus ring 26 made of, for example, silicon, is arranged around the electrostatic chuck 18 and on the upper surface of the susceptor 16. A cylindrical inner wall member 28 made of, for example, quartz, is attached to side surfaces of the susceptor 16 and the susceptor support 14.

A coolant chamber or a coolant passage 30 extending, for example, in a circumferential direction, is provided inside the susceptor support 14. A coolant having a predetermined temperature, for example, coolant water cw is supplied and circulated to the coolant passage 30 from an external chiller unit (not shown in the drawing) through pipes 32a and 32b. A processing temperature of the wafer W on the susceptor 16 can be controlled by the temperature of the coolant cw. Moreover, a heat transfer gas, for example, a He gas, from a heat transfer gas supply mechanism (not shown in the drawing) is supplied to a location between the upper surface of the electrostatic chuck 18 and the back surface of the wafer W through a gas supply line 34.

A first high frequency power source 36 for plasma generation and a second high frequency power source 38 for ion drawing-in are electrically connected to the susceptor 16 through lower matching boxes 40 and 42 and lower power feeding bars 44 and 46, respectively.

The first high frequency power source 36 outputs a first high frequency power having a high frequency suitable for plasma generation, for example, of 60 MHz or 100 MHz. On the other hand, the second high frequency power source 38 outputs a second high frequency power having a low frequency suitable for drawing ions of the plasma onto the wafer W on the susceptor 16, for example, of 0.8 MHz.

An upper electrode 48 is provided above and opposite to the susceptor 16 and in parallel therewith. This upper electrode 48 is constituted of an electrode plate 50 having many blow holes 50a and made of a semiconductor material such as Si or SiC, and an electrode support 52 that supports the electrode plate 50 detachably and is attached to an upper portion of the chamber 10 through a ring-shaped insulator 54. The electrode support 52 is made of a conductive material, for example, aluminum whose surface is alumited. A plasma generation space or a processing space S is set between the upper electrode 48 and the susceptor 16. The ring-shaped insulator 54 is made of, for example, alumina ($Al_2O_3$), and hermetically seals a gap between an outer circumferential surface of the upper electrode 48 and a side wall of the chamber 10, and physically supports the upper electrode 48 without connecting the upper electrode 48 to the ground.

The electrode support 52 includes a gas buffer chamber 56 therein, and many gas vents 52a are in communication with the blow holes 50a of the electrode plate 50 from the gas buffer chamber 56 in the lower surface thereof. A gas supply source 60 is connected to the gas buffer chamber 56 through a gas supply pipe 58, and a mass flow controller (MFC) 62 and an opening and shutting valve 64 are provided in the gas supply pipe 58. When a predetermined process gas is introduced into the gas buffer chamber 56 from the gas supply source 60, the process gas is blown out of the blow holes 50a of the electrode plate 50 toward the wafer W on the susceptor 16 in a shower form. In this manner, the upper electrode 48 doubles as a shower head to supply the process gas to the processing space S.

A third high frequency power source 66 for plasma excitation is electrically connected to the upper electrode 48 through the upper matching box 68 and an upper feeding conductivity such as the conductive feeding bar 70. The third high frequency power source 66 outputs a third high frequency power. Here, a frequency of the third high frequency power source is usually selected from a range of 27 to 300 MHz.

An annular space formed between outer side walls of the susceptor 16 and susceptor support 14 and the side wall of the chamber 10 is an exhaust space, and an exhaust opening 72 of the chamber 10 is provided in the bottom of the exhaust space. An exhaust device 76 is connected to the exhaust opening 72 through an exhaust pipe 74. The exhaust device 76 includes a vacuum pump such as a turbo molecular pump, and is configured to be able to reduce the pressure of the inside of the chamber 10, especially the processing space S to an intended degree of vacuum. Furthermore, a gate valve 80 is attached to the side wall of the chamber 10 to open and close a transfer opening 78 of the wafer W.

One terminal of a variable direct-current power source 82 installed outside the chamber 10, that is to say, an output terminal, is electrically connected to the upper electrode 48 through a switch 84 and a direct-current power feeding line 85. The variable direct-current power source 82 is configured to output a direct voltage $V_{DC}$, for example, in a range of −2000 to +1000 V. The other terminal of the variable direct-current power source 82 is grounded. A polarity and an absolute value of the output (voltage and current) of the variable direct-current power source 82 and switching between turning on and off a switch 84 are controlled by a DC controller 83 under an instruction from a control unit 88 described later.

While a filter circuit 86 provided in the middle of the direct-current power feeding line 85 applies the direct voltage $V_{DC}$ from the variable direct-current power source 82 to the upper electrode 48 without any change, the filter circuit 86 is configured so as not to flow high frequency power going into the direct-current power feeding line 85 by passing through the processing space S and the upper electrode 48 from the susceptor 16 toward the variable direct-current power source 82 side by causing the high frequency power to flow to the grounded line.

In addition, a DC grounding member (not shown in the drawing) made of a conductive material such as Si, SiC or the like is attached to a location facing the processing space S in the chamber 10. This DC grounding member is always grounded through the grounded line (not shown in the drawing).

The control unit 88 includes a CPU (Central Processing Unit), a ROM (Read Only Memory), and RAM (Random Access Memory) (which are not shown in the drawing), and the CPU controls implementation of a process in accordance with, for example, a variety of recipes stored in the RAM.

In the plasma processing apparatus 1 having such a configuration, in order to perform etching, to begin with, the gate valve 80 is opened and a wafer W held on a transfer arm (not shown in the drawing) is carried into the chamber 10. The wafer W is held by pusher pins (not shown in the drawing), and placed on the electrostatic chuck 18 by lowering the pusher pins. After carrying the wafer W in the chamber 10, the gate valve 80 is closed, and etching gases are introduced into the chamber 10 at predetermined flow rates and a predetermined flow ratio while the pressure in the chamber 10 is reduced to a preset value by the exhaust device 76. Furthermore, the first high frequency power source 36, the second high frequency power source 38 and the third high frequency power source 66 supply predetermined high frequency power to the susceptor 16. Moreover, a direct voltage is applied to the chuck electrode 20 of the electrostatic chuck 18 from the direct-current power source 22, with the wafer W fixed on the electrostatic chuck 18. The etching gases introduced from the shower head in a shower form are converted to plasma mainly by the high frequency power supplied from the first high frequency power source 36, thereby etching a main surface of the wafer W by radicals and ions in the generated plasma. In addition, the ions can be drawn toward the wafer mainly by the high frequency power supplied from the second high frequency power source 38.

After finishing the plasma etching, the wafer is lifted up and held by the pusher pins, and after the gate valve 80 is opened and the transfer arm is transferred into the chamber, the pusher pins are lowered and the wafer W is held on the transfer arm. Next, the transfer arm goes out of the chamber 10, and the next wafer W is carried into the chamber 10 by the transfer arm. By repeating this process, the wafers W are processed continuously.

[Operation]

Figure 8:
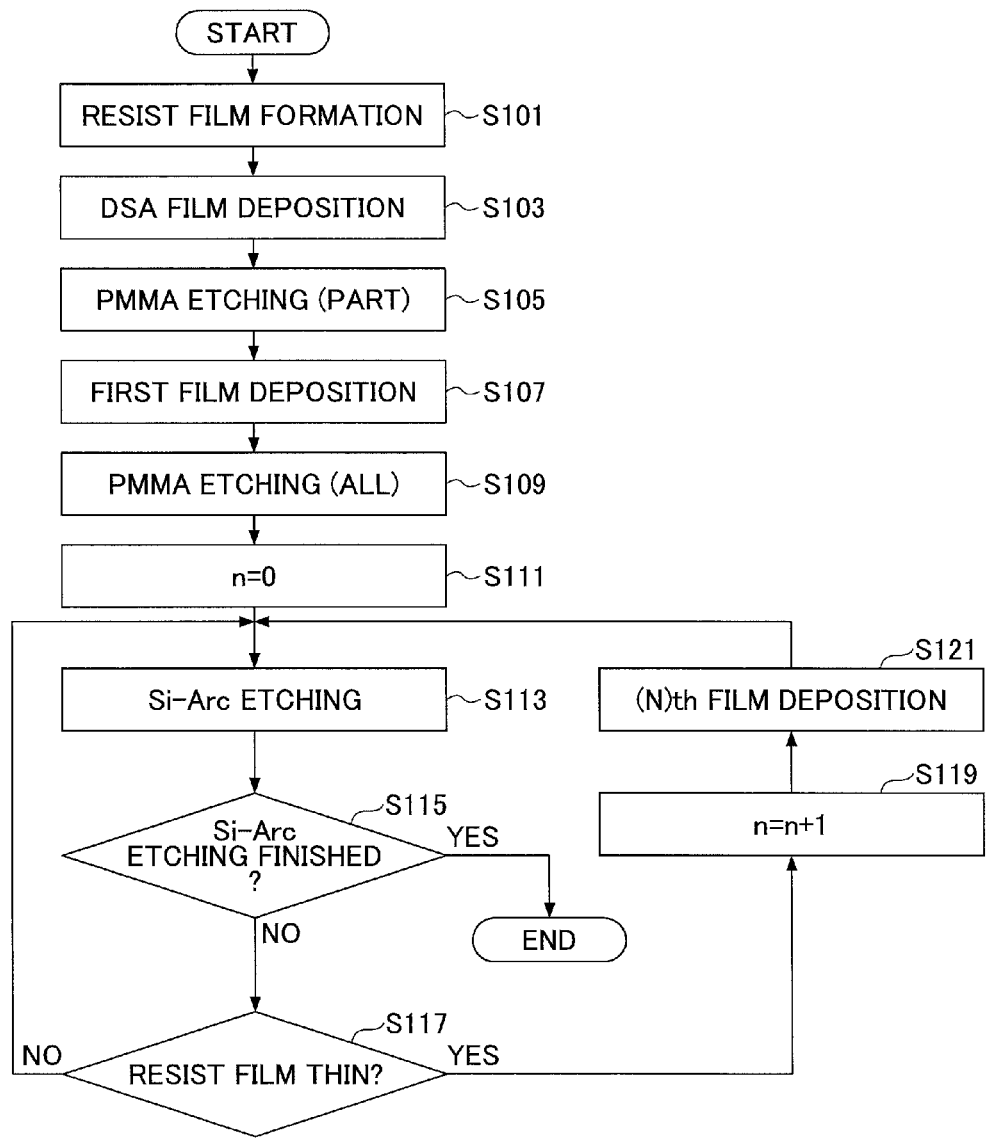
FIG. 8 is a flowchart illustrating an etching process according to the first embodiment.
Figure 9:
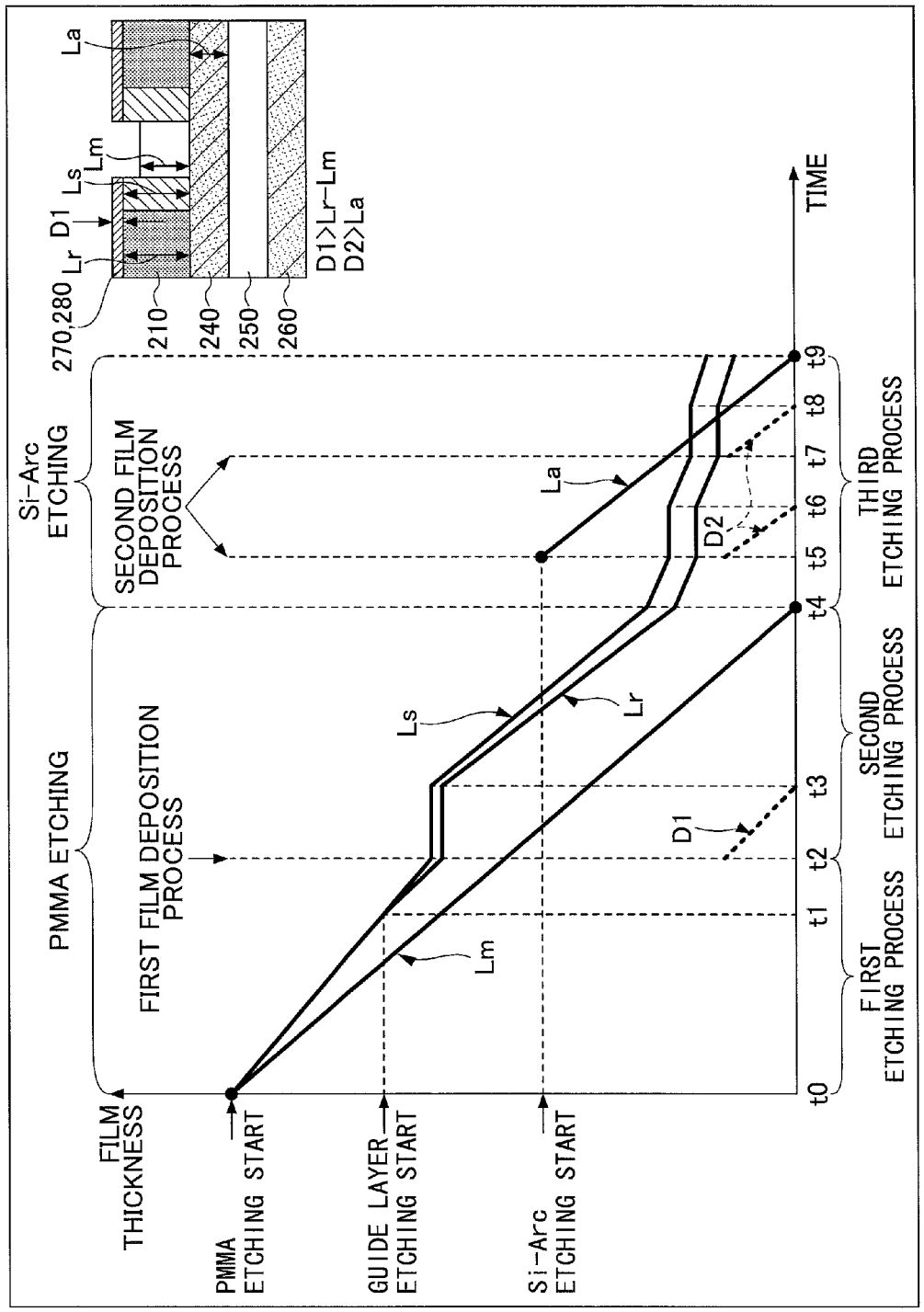
FIG. 9 is a time chart illustrating the etching process according to the first embodiment.

Next, a description is given below of operation using the plasma processing apparatus described above with reference to FIGS. 8 and 9. FIG. 8 is a flowchart illustrating an etching process according to a first embodiment. FIG. 9 is a time chart illustrating the etching process according to the first embodiment.

Here, the following operation of the plasma processing apparatus is controlled by the control unit 88. Moreover, FIG. 9 shows time on the horizontal axis and film thickness on the vertical axis. With respect to the film thicknesses illustrated in the graph, Lm shows a film thickness of the PMMA 230; Ls shows a film thickness of the PS 220; Lr shows a film thickness of the guide layer 210; La shows a film thickness of the Si—Ar layer 240; D1 shows a film thickness of the first protective layer; and D2 shows a film thickness of the second protective layer.

When the etching process according to the first embodiment illustrated in FIG. 8 is started, to begin with, a guide layer 210 (resist film) is formed on a Si-Arc layer 240 that is an underlayer film (step S101). Next, after applying a PMMA 230 and a PS 220 on the guide layer 210, by heating and self-assembling the PMMA 230 and the PS 220, a DSA is deposited (step S103).

(PMMA Etching)

Next, a part of the PMMA 230 is etched (step S105). A time period of the etching is shown as a time period from time t0 to time t2 (first etching process).

At time t0, etching the PMMA 230 is started, and etching the PS 220 on the guide layer 210 illustrated at S12 in FIG. 6 advances in conjunction with the etching of the PMMA 230. When the PS 220 on the guide layer 210 is removed at time t1, etching the guide layer 210 is started because the guide layer 210 is exposed. In other words, after time t1, the guide layer 210 and the PS 220 illustrated in step S13 in FIG. 6 are etched while the PMMA 230 is etched. Because the components of the base portions of the PMMA 230 and the guide layer 210 have approximately the same structure, inclinations of the Lm and the Lr, that is to say, etching rates of the PMMA 230 and the guide layer 210 are approximately the same. Although a difference in the inclinations between the Lr and the Ls is determined by types of gases, here, the inclination of the Lr is made greater than the inclination of the Ls during the etching of the PMMA.

Next, a first film deposition process is performed (step S107). This causes a first protective film 270 of step S14 in FIG. 6 to be deposited. In FIG. 9, starting the first film deposition process at time t2 is illustrated, but a time period of the first film deposition process is not illustrated for the sake of convenience.

Next, all of the remaining PMMA 230 is etched (step S109). This etching time is illustrated as a time period from time t2 to time t4 in FIG. 9 (second etching process). During the time, for a time period from time t2 to time t3, the guide layer 210 and the PS 220 are not etched because the first protective film remains. When the first protective film 270 is removed at time t3, the guide layer 210 and the PS 220 are etched for a time period from time t3 to time t4.

Thus, in the etching process of the PMMA 230, by depositing the first protective film 270, the guide layer 210 and the PS 220 remain at the time when the etching of the PMMA 230 is finished. This allows the guide layer 210 and the PS 220 to function as a mask in the next etching of the Si-Arc layer 240.

(Si-Arc Etching)

Next, after initializing a film deposition counter (step S111), the Si-Arc layer 240 is etched (step S113). An etching time period of the Si-Arc layer 240 is illustrated as a time period from time t4 to time t9 in FIG. 9 (third etching process). Etching the Si-Arc layer 240 starts at time t4, and etching the guide layer 210 and the PS 220 goes along with the etching of the Si-Arc layer 240.

Subsequently, whether or not the etching of the Si-Arc layer 240 is finished is determined (step S115), and the process flow is finished when the etching has ended. When the etching has not finished, the process goes to step S117, and whether or not the film thickness Lr of the guide layer 210 is thinned to a predetermined threshold value is determined. When the film thickness Lr of the guide layer 210 has not been thinned to the predetermined threshold value, the process returns to step S113 and the Si-Arc layer 240 is further etched. When the film thickness Lr of the guide layer 210 has been thinned to the predetermined value, the process goes to step S119, and after the film deposition counter is incremented by one, the (n+1)th film deposition process, that is to say, a first round of the second film deposition process is performed (step S121). This causes the second protective film 280 in step S16 of FIG. 6 to be deposited. Next, the process returns to step S113, and the Si-Arc layer 240 is etched again.

In FIG. 9, the first round of the second film deposition process starts at time t5. Here, a time period for the second film deposition process is not illustrated for the sake of convenience. For a time period from time t5 to time t6, the guide layer 210 and the PS 220 are not etched because the second protective film 280 remains. When the second protective film 280 is removed at time t6, for a time period from time t6 to time t7, the guide layer 210 and the PS 220 are etched. Here, in the etching of the Si-Arc layer 240, the slope between the film thickness Lr and the film thickness Ls is determined by types of the utilized gases.

When the film thickness Lr of the guide layer 210 becomes thin after finishing the etching of the Si-Arc layer 240, it is determined that step S117 is YES again, and after incrementing the film deposition counter by one in step S119 again, the (n+1)th, that is to say, a second round of the second film deposition is performed (step S121), and the process returns to step S113, in which the Si-Arc layer 240 is etched again.

In FIG. 9, the second round of the second film deposition is started at time t7. Here, a time period of the second film deposition process is not illustrated either for the sake of convenience. This causes the second protective film 280 of step S16 in FIG. 6 to be deposited again. Because the second protective film remains for a time period from time t7 to time t8, the guide layer 240 and the PS 220 are not etched. When the second protective film 280 is removed at time t8, the guide layer 210 and the PS 220 are etched for a time period from time t8 to time t9. When the time reaches time t9, it is determined that the etching of the Si-Arc layer 240 is finished (step S115), the process flow finishes.

[Effect/Experimental Results]

Figure 10:
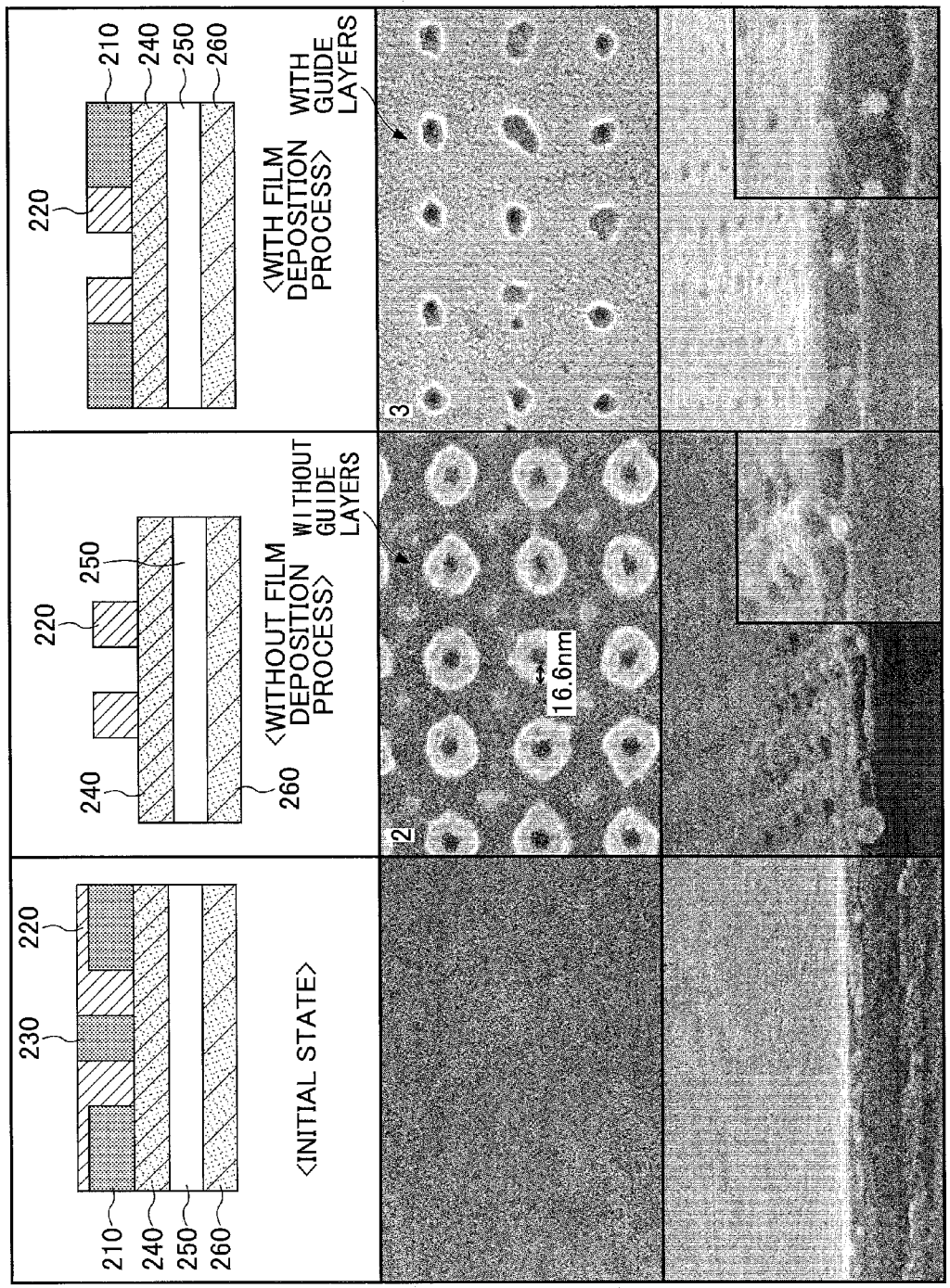
FIG. 10 is a diagram illustrating an example of an effect of forming a protective layer according to the first embodiment.

As described above, according to the embodiments, the first protective film 270 is deposited in the first film deposition process during the etching of the PMMA 230. This can leave the guide layer 210 while etching the PMMA 230. An experimental result is shown in FIG. 10. FIG. 10 shows the presence or the absence of the guide layer 210 by photographs taken by an electron microscope. In FIG. 10, a case of <Without First Film Deposition Process> and a case of <With First Film Deposition Process> are shown relative to <Initial State>. In the case of <Without First Film Deposition Process> in FIG. 10, it is noted that holes are formed inside convex portions showing the PS 220, and the guide layers 210 that should be originally located outside the PS 220 are thinned or removed in places. In contrast, in the case of <With First Film Deposition Process> in FIG. 10, holes are formed inside the PS 220, and the guide layers outside the PS 220 remain. As discussed above, it is found that a preferable etching result can be obtained by performing the first film deposition process in etching the PMMA 230.

Figure 11:
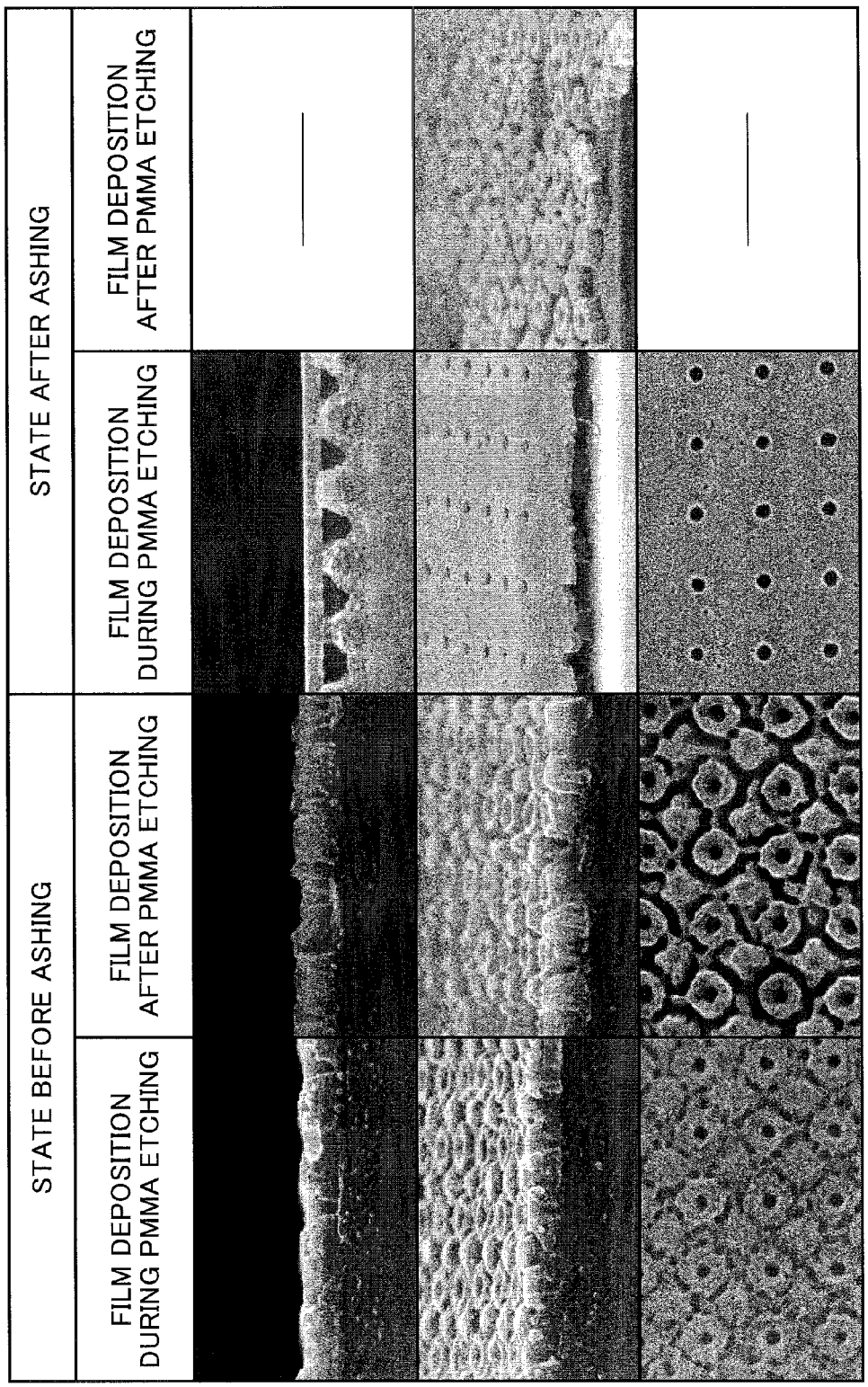
FIG. 11 is a diagram illustrating an example of an effect of forming the protective layer according to the first embodiment.

Next, a description is given below of a timing when the first film deposition process is performed, with reference to FIG. 11. FIG. 11 includes photographs taken by an electron microscope and shows a difference of effects between a case of depositing the first protective film 270 in the middle of etching the PMMA 230 and a case of depositing the first protective film 270 after etching the PMMA 230. FIG. 11 shows a state before ashing on the left hand side and a state after ashing on the right hand side. When the first protective film 270 is deposited in the middle of etching the PMMA 230, the guide layer 210 remains thick in the state before the ashing, and the formation of holes can be recognized even in the state after the ashing.

In contrast, when the first protective film 270 is deposited after etching the PMMA 230, a part of the guide layer 210 is thinned or removed in the state before the ashing, and a shape of the holes cannot be seen after the ashing. This is because the guide layer 210 becomes considerably thin and the carbon layer 250, which is the underlayer of the Si-Arc layer 240, is removed from the guide layer 210, which has become thin while ashing, thereby losing the shape of the holes. From these experimental results, it is determined that the first film deposition process needs to be performed during the etching of the PMMA 230, and a preferable result cannot be obtained even if the first film deposition process is performed after etching the PMMA 230.

Furthermore, in the first film deposition process, a contrivance during the film deposition is needed to prevent the first protective film 270 from depositing in a depression formed on the top of the PMMA 230 and to deposit only on a top surface of the guide layer 210 and the PS 220. This can be implemented by etching a part of the surface of the PMMA 230 before the first film deposition process and by controlling the pressure in the chamber to be set at a predetermined pressure when performing the first film deposition process. A description is given later of the pressure control during the film deposition.

The depression formed in the PMMA 230 before the first film deposition process is preferably equal to or deeper than 20 nm. This is because the first protective film 270 can be deposited even on the PMMA 230 due to insufficient depth of the depressions when the depression is shallower than 20 nm. Hence, the first film deposition process should be performed after the PMMA 230 is etched up to the depth of 20 nm or deeper in the first etching process.

The depression formed in the PMMA 230 before the first film deposition process is preferably equal to or shallower than 80 nm. In other words, the depression just has to have the depth in a range of 20 to 80 nm. This is because the guide layer 210 thinned out in the first etching process before the first protective film 270 is deposited and the shape of the holes may not be able to be maintained after the ashing as shown in FIG. 11 when the depression is deeper than 80 nm. Accordingly, the first film deposition process should be performed after the PMMA 230 is etched up to the depth of 20 nm or deeper and 80 nm or shallower in the first etching process. The first film deposition process can be performed a plurality of times without being limited to one time.

On the other hand, although the second film deposition process is performed twice in the above embodiment, the process is not limited to this, and the second film deposition process may not be performed, or may be performed once or more than twice. In other words, the second film deposition process just has to be performed as necessary before or in the middle of etching the Si-Arc layer 240, or may not be performed if not needed. Whether to perform the second film deposition process or not just has to be determined depending on selective ratios of the guide layer 210 to the Si-Arc layer 240 and of the second protective layer 280 to the Si-Arc layer 240, and the number of times of the film deposition of the second protective film 280 is preferably changed to an optimum number of times depending on the above selective ratios.

Second Embodiment

[Etching Process]

Figure 12:
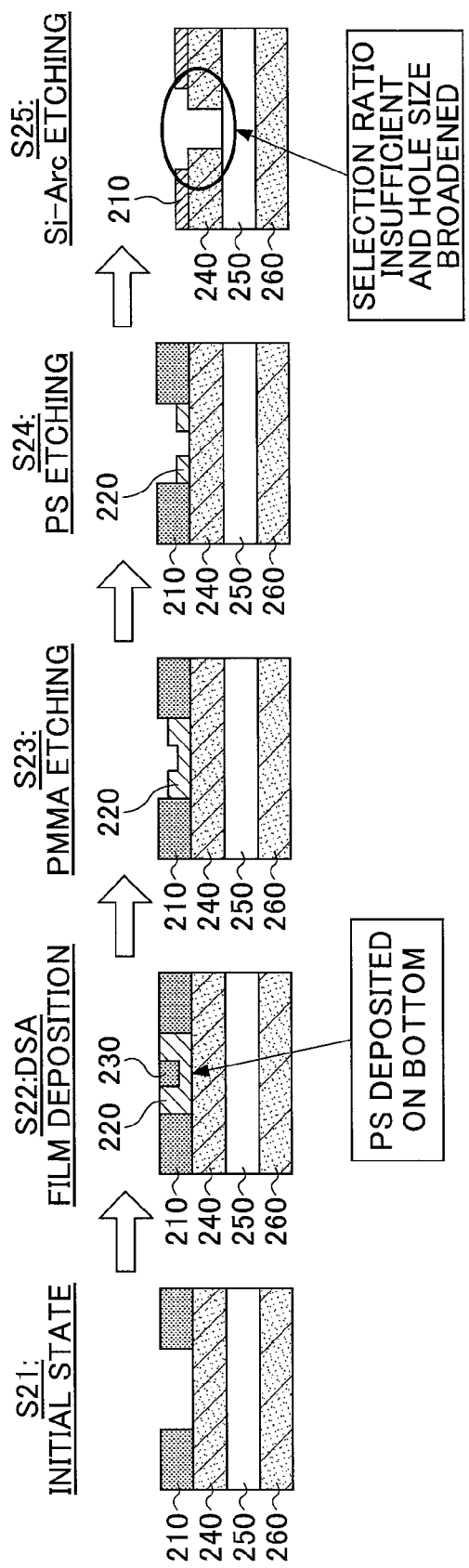
FIG. 12 is a diagram for explaining a problem to be solved by the second embodiment.

Next, a description is given below of an etching process according to a second embodiment. An initial state of step S21 is illustrated in FIG. 12. As illustrated in step S22 in FIG. 12, when a DSA is deposited, a PS 220 frequently surrounds the PMMA 230 and is deposited under the bottom of the PMMA 230 depending on the property of an underlayer film.

In such a case, after the etching of the PMMA 230 illustrated in step S23 in FIG. 12, as illustrated in step S24, a process of etching a PS deposited under the PMMA 230 is necessary.

However, by adding this etching process, the film thicknesses of the guide layer 210 and the PS 220 become further thinner, and a selective ratio to a Si-Arc layer 240 is insufficient when the Si-Arc layer 240 that is the underlayer film is etched, which results in expansion of a diameter of the hole as illustrated in step S25 in FIG. 12.

Figure 13:
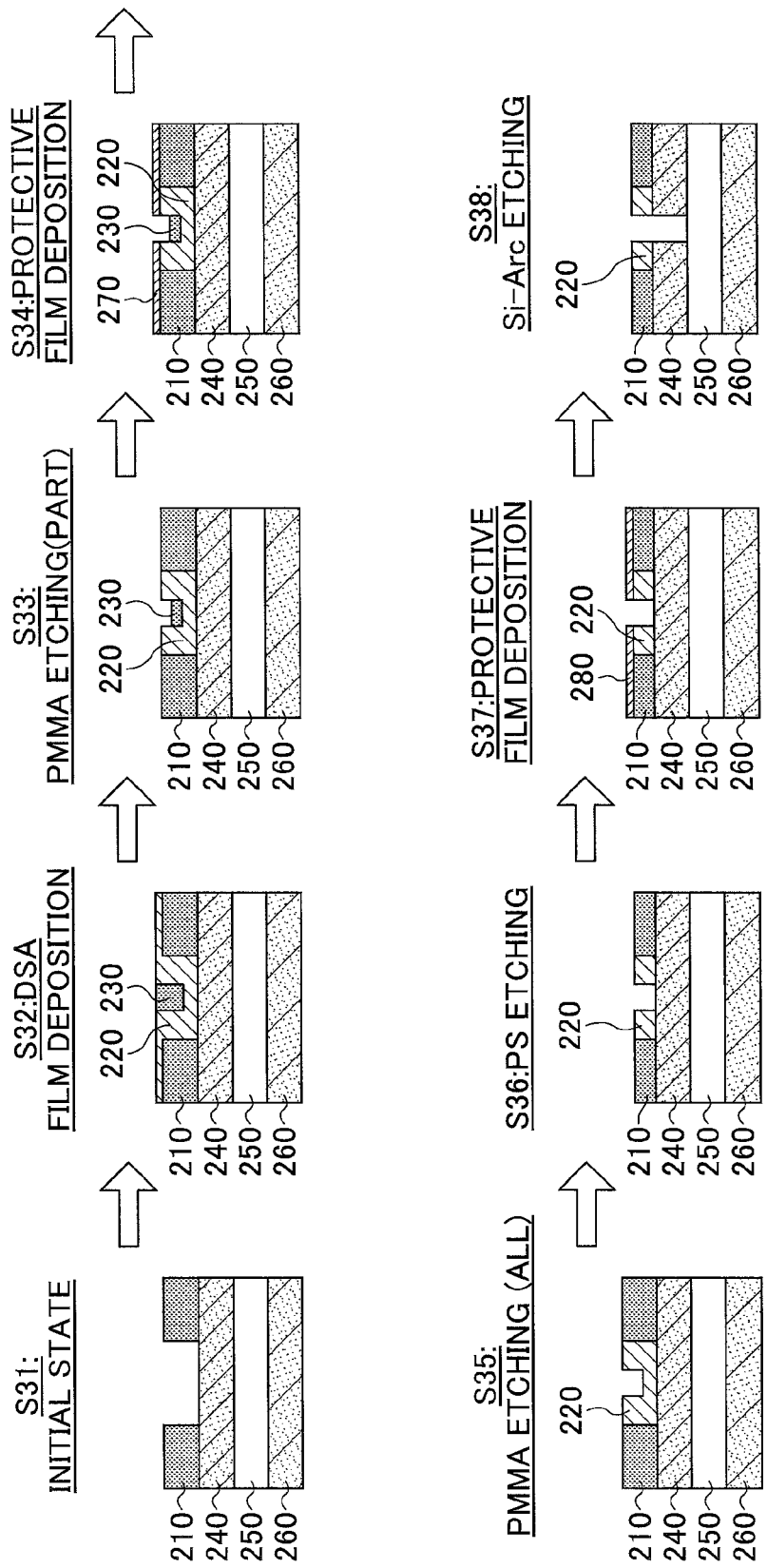
FIG. 13 is a diagram illustrating an etching process of a periodic pattern according to the second embodiment.

Therefore, in the second embodiment, the etching process of the PS illustrated in step S36 in FIG. 13 is added to the hole formation process in the first embodiment, and a second protective film 280 that protects the guide layer 210 and the PS 220 is deposited in a film deposition process in step S37 in FIG. 13 after the etching process. Here, the etching process of the PS in step S36 in FIG. 13 corresponds to a fourth etching process that etches the PS formed between the PMMA 230 and the Si-Arc layer 240 that is the underlayer film thereof by plasma generated from a fifth gas after the second etching process.

Here, process conditions of the fourth etching process are as follows.
Pressure: 20 (mTorr) (=2666.44 Pa)
High Frequency Power: HF for Plasma Generation 150 (W)/LF for Bias 50 (W)
Fifth Gas: $CF_4/O_2=75/5$ (sccm)
Process Time: 15 (seconds)

[Operation]

Figure 14:
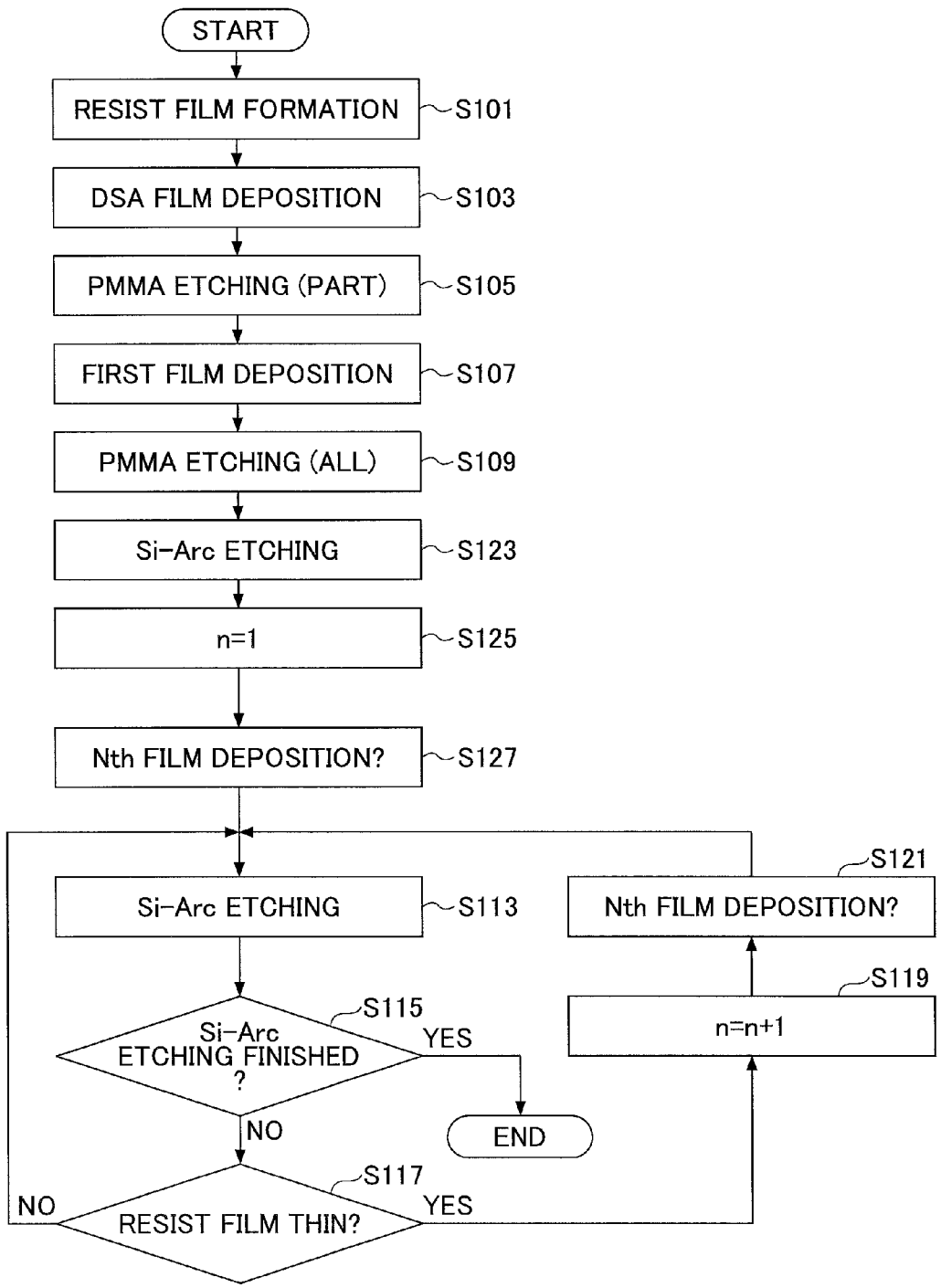
FIG. 14 is a flowchart illustrating the etching process according to the second embodiment.
Figure 15:
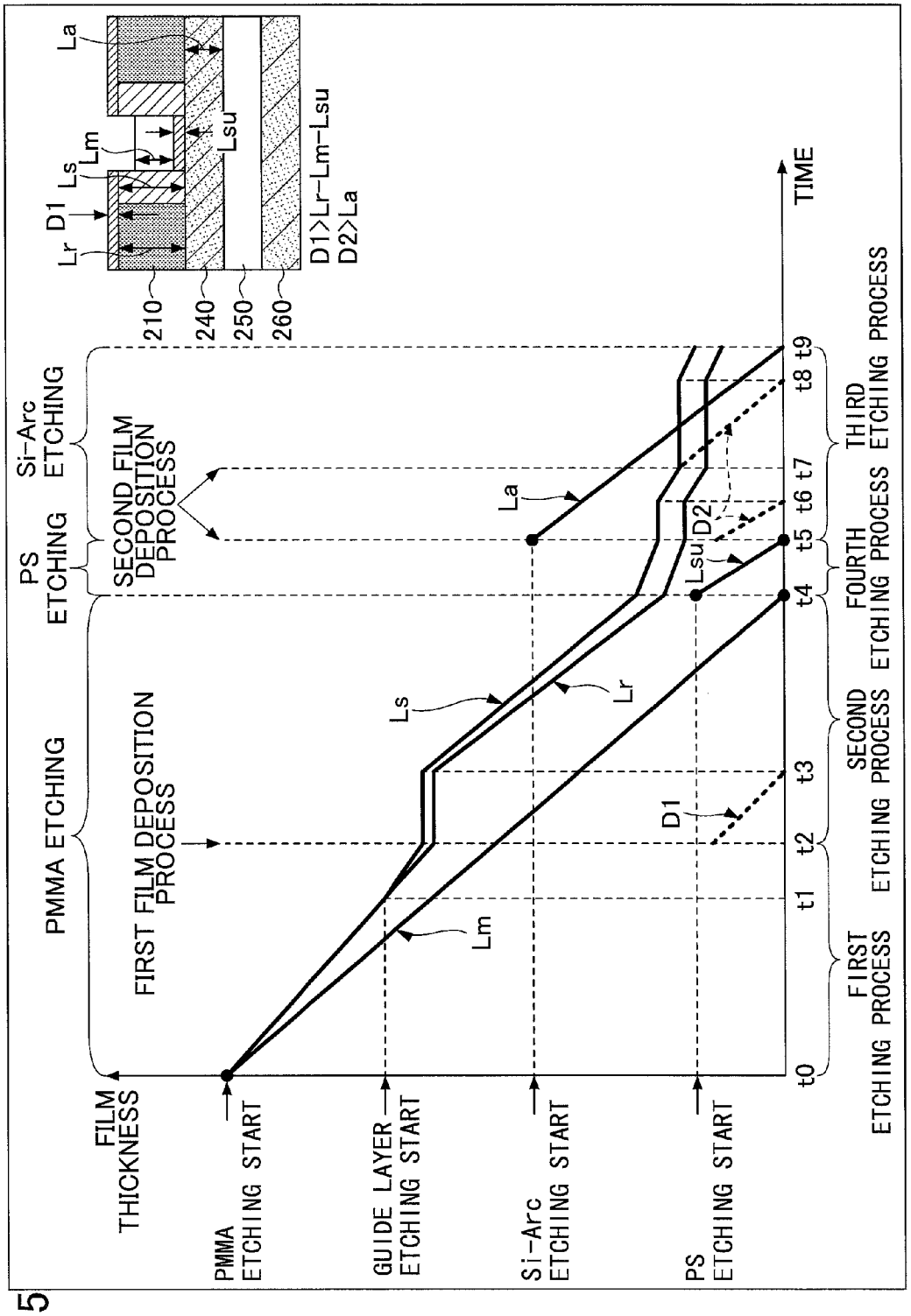
FIG. 15 is a time chart illustrating the etching process according to the second embodiment.

Next, a description is given of operation for performing the process described above by using a plasma processing apparatus with reference to FIGS. 14 and 15. FIG. 14 is a flowchart illustrating an etching process according to a second embodiment. FIG. 15 is a time chart illustrating the etching process according to the second embodiment. Among film thicknesses illustrated in a graph in FIG. 15, Lsu is a film thickness of the PS 220 having surrounded and deposited under the PMMA 230.

(PMMA Etching)

Upon starting the etching process of the embodiment illustrated in FIG. 14, to begin with, a guide layer 210 is deposited on a Si-Arc layer 240 that is an underlayer film (step S101). Next, a DSA is deposited by applying and heating a PMMA 230 and a PS 220 on the guide layer 210 (step S103). Next, a part of the PMMA 230 is etched (step S105). This etching time period is illustrated as a time period from time t0 to time t2 in FIG. 15 (first etching process). At time t0, etching the PMMA 230 starts, and etching the PS 220 on the guide layer 210 illustrated in step S32 in FIG. 13 advances along with the etching of the PMMA 230, and when the PS 220 is removed on the guide layer 210 at time t1, etching the guide layer 210 starts at time t1 because the guide layer 210 is exposed. In other words, the guide layer 210 and the PS 220 illustrated in step S33 in FIG. 13 are etched along with the etching of the PMMA 230 after time t1.

Next, a first film deposition process is performed at time t2 of FIG. 15 (step S107). This causes a first protective film 270 to be deposited. A time period for the first film deposition process is not illustrated for the sake of convenience. Next, all of the remaining PMMA 230 are etched (step S109). This etching time period is illustrated as a time period from time t2 to time t4 in FIG. 15 (second etching process). During this time period, because the first protective film is left for a time period from time t2 to time t3, the guide layer 270 and the PS 220 are not etched. At time t3, because the first protective film 270 has been removed, the guide layer 210 and the PS 220 are etched for a time period from time t3 to time t4.

In this manner, by depositing the first protective film 270 in the etching process of the PMMA 230, a predetermined amount or more of the guide layer 210 and the PS 220 can be left at time when the etching of the PMMA 230 has finished.

(PS Etching)

Next, the PS 220 having surrounded and deposited under the bottom of the PMMA 230 is etched (step S123). This etching time period is illustrated as a time period from time t4 to time t5 in FIG. 15 (fourth etching process).

Next, after incrementing the film deposition counter by one (step S125), at time t5 of FIG. 15, an nth, that is to say, a first round of a second film deposition process is performed (step S127). This causes a second protective film 280 to be deposited. A time period for the second film deposition process is not illustrated in the drawing for the sake of convenience.

(Si-Arc Etching)

Next, a Si-Arc layer 240 is etched (step S113). This etching time period is illustrated as a time period from time t5 to time t9 (third etching process). At time t5, etching the Si-Arc layer 240 starts, and the guide layer 210 and the PS 220 are not etched for a time period from time t5 to time t6 because the second protective film 280 remains. When the second protective film 280 is removed at time t6, the guide layer 210 and the PS 220 are etched for a time period from time t6 to time t7.

Next, whether the etching of the Si-Arc film 240 is finished or not is determined (step S115), and the process flow ends when the etching is finished. When the etching is not finished, the process advances to step S117, and a determination is made as to whether or not a film thickness Lr of the guide layer 210 becomes thin by, for example, comparing the film thickness Lr with a predetermined threshold value. When the film thickness Lr of the guide layer 210 has not become thin, the process returns to step S113, and the Si-Arc layer 240 is further etched. When the film thickness Lr of the guide layer 210 has become thin, after going to step S119 and incrementing the film deposition counter by one, an (n+1)th, that is to say, a second round of the second film deposition process is performed (step S121), and the process returns to step S113, in which the Si-Arc layer 240 is etched again.

In FIG. 15, the second round of the second film deposition is started at time t7. This causes the second protective film 280 to be deposited again. Because the second protective film 280 remains for a time period from time t7 to time t8, the guide layer 210 and the PS 220 are prevented from being etched. When the second protective film 280 is removed at time t8, the guide layer 210 and the PS 220 are etched for a time period from time t8 to time t9. When the time reaches time t9, it is determined that the etching of the Si-Arc layer 240 is finished (step S115), and the process flow ends.

[Effect]

As described above, according to the embodiment, by depositing the first protective film 270, the PMMA 230 can be etched so as to form a preferable hole shape. Moreover, after the etching of the PS 220 having surrounded and deposited under the bottom of the PMMA 230, by depositing the second protective film 280, the Si-Arc layer 240 can be etched so as to form a preferable hole shape.

[Pressure Dependency]

Figure 16:
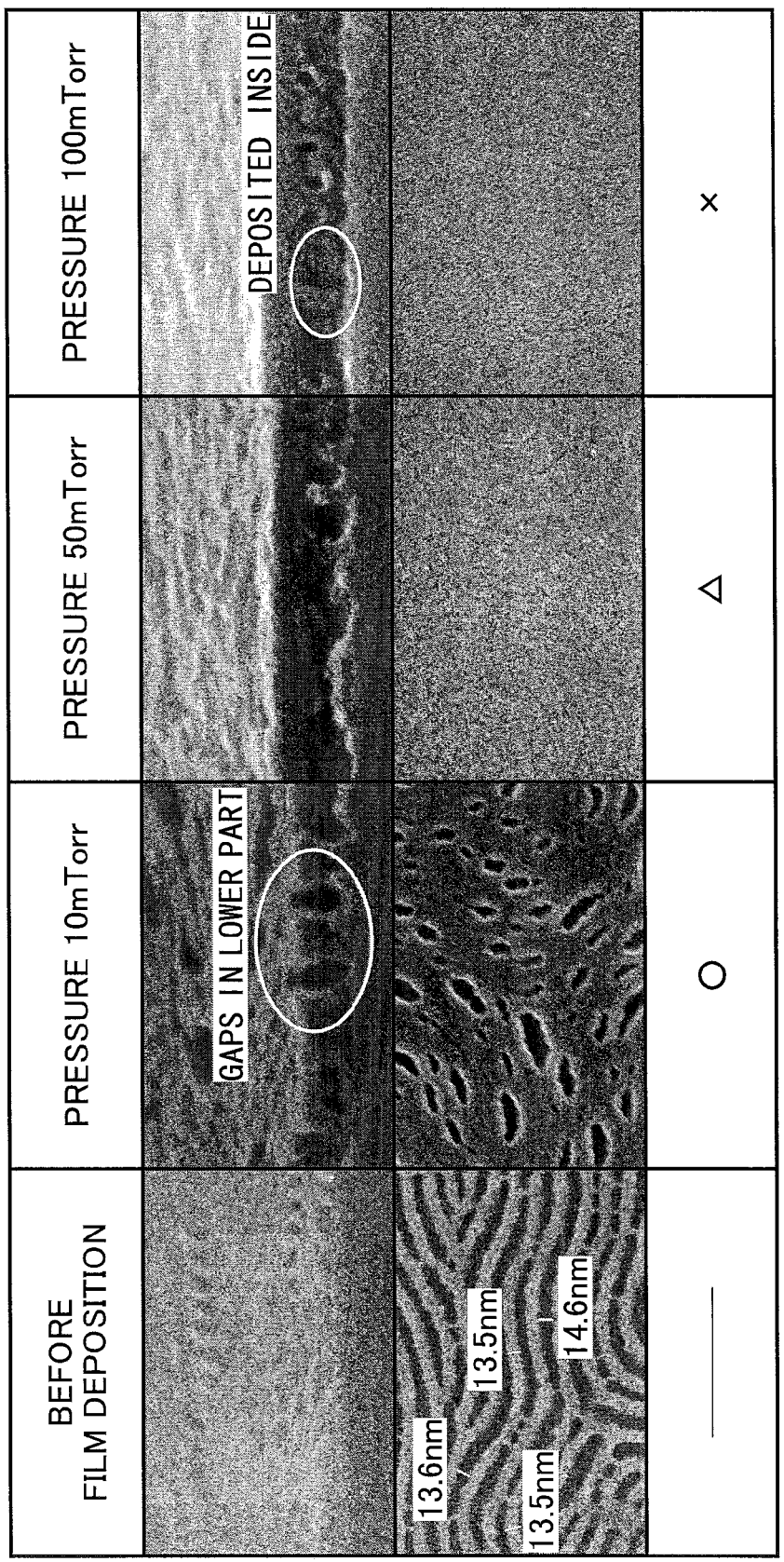
FIG. 16 is a diagram illustrating pressure dependency in the first and second embodiments.

Next, a description is given below of pressure dependency in the first film deposition process with reference to FIG. 16. FIG. 16 shows an experimental result of the pressure dependency according to the first and second embodiments. Process conditions are as follows.

Pressure: Variable
High Frequency Power Source: HF for Plasma Generation 500 (W)/LF for Bias 0 (W)
Second Gas: $SiCl_4/O_2/He=25/25/200$ (sccm)
Process Time: 10 (seconds)

From the photographs taken by a microscope, it is found that when the pressure in the chamber is increased to 100 mTorr (=13332.2 Pa), because there is no gap in a portion where the hole is to be formed, the PMMA 230 reacts with plasma at an upper portion of the PMMA 230 and inside of the PMMA 230, and a film is attached to the upper portion and the inside of the PMMA 230. In contrast, it is found that when the pressure in the chamber is controlled so as to be 10 to 50 mTorr (=1333.22 to 6666.1 Pa), there are gaps in a portion where the hole is to be formed, and a film does not attach to the upper portion and the inside of the PMMA 230.

Examining the reasons, when the pressure in the chamber is controlled to be set at 100 mTorr (=133332.2 Pa) on a high pressure side, because the plasma stays in the chamber for a long period of time, the surface and the inside of the PMMA 230 react with the plasma and the film deposition is expedited. On the other hand, it is thought that when the pressure in the chamber is controlled to be 10 to 50 mTorr (=1333.22 to 6666.1 Pa) on a lower pressure side, because the plasma stays in the chamber for a short period of time and is exhausted immediately, the film deposition is not expedited at the surface and the inside of the PMMA 230.

As discussed above, in the first film deposition process, the second gas is preferably introduced into the chamber in which the pressure is controlled to be 10 to 50 mTorr (1333.2 to 6666.1 Pa). By performing the first film deposition process in the chamber with the pressure controlled to be the above pressure, the first protective film is not deposited in a depression formed in a part of the PMMA 230, and can be deposited on a top surface of the guide layer 210 and the PS 220. This allows the PMMA 230 on which the first protective film is not deposited to be etched.

[Gas Species Dependency]

Figure 17:
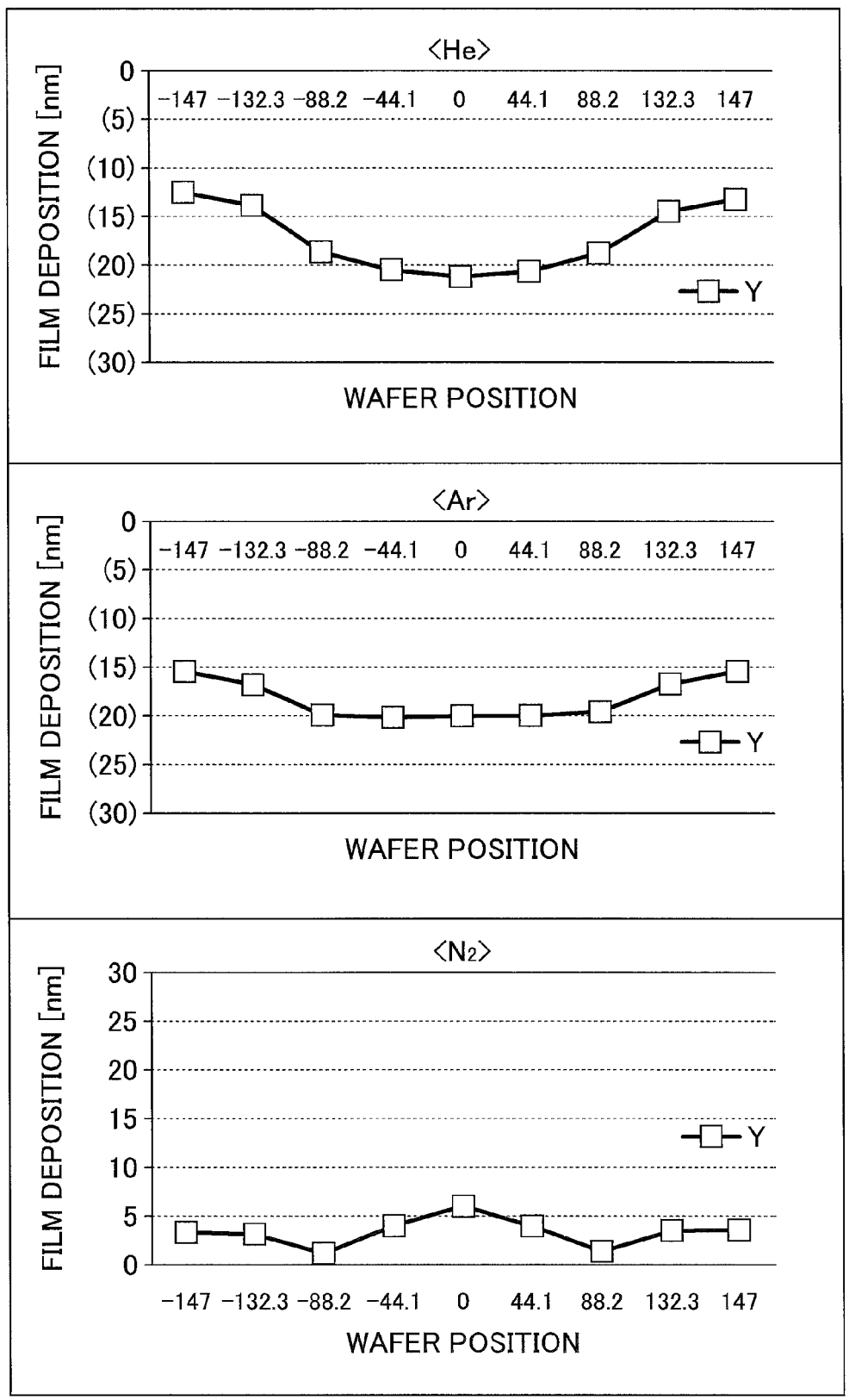
FIG. 17 is a diagram illustrating gas species dependency in the first and second embodiments.

Next, a description is given below of gas species dependency in the first film deposition process with reference to FIG. 17. FIG. 17 is an experimental result showing the gas species dependency of the first and second embodiments. Process conditions are as follows.

Pressure: 10 (mTorr) (=1333.22 Pa)
High Frequency Power: HF for Plasma Generation 500 (W)/LF for Bias 0 (W)
Second Gas: $SiCl_4/O_2/He$, Ar or $N_2=25/25/200$ (sccm)
Process Time: 10 (seconds)

Figure 18:
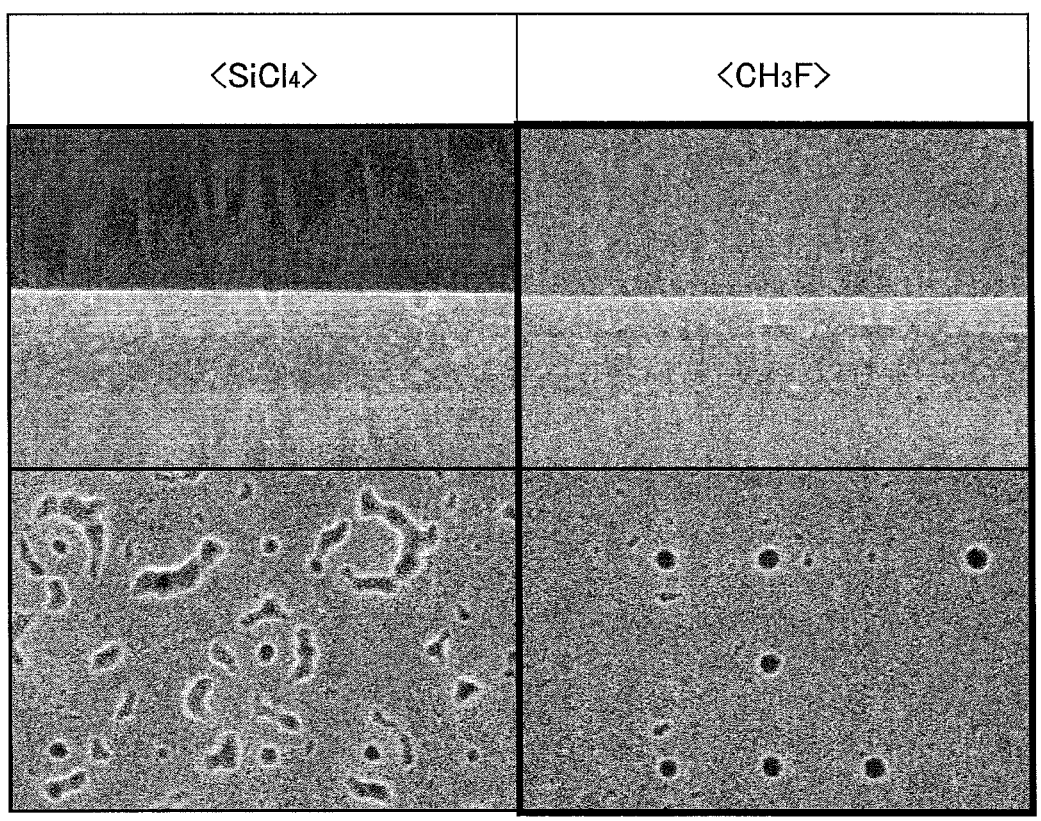
FIG. 18 is a diagram illustrating gas species dependency in the first and second embodiments.

When looking at the experimental result in FIG. 18, when a $CH_3F$ gas is used as gas species of the second film deposition process instead of the $SiCl_4$ gas, a state of the deposited second protective film is sometimes better than a state of using the $SiCl_4$ gas, and therefore the $CH_3F$ gas can be used as the gas species used in the second film deposition process instead of the $SiCl_4$ gas.

[Gas Species Dependency/F-Based Gas Inclusion]

Figure 19:
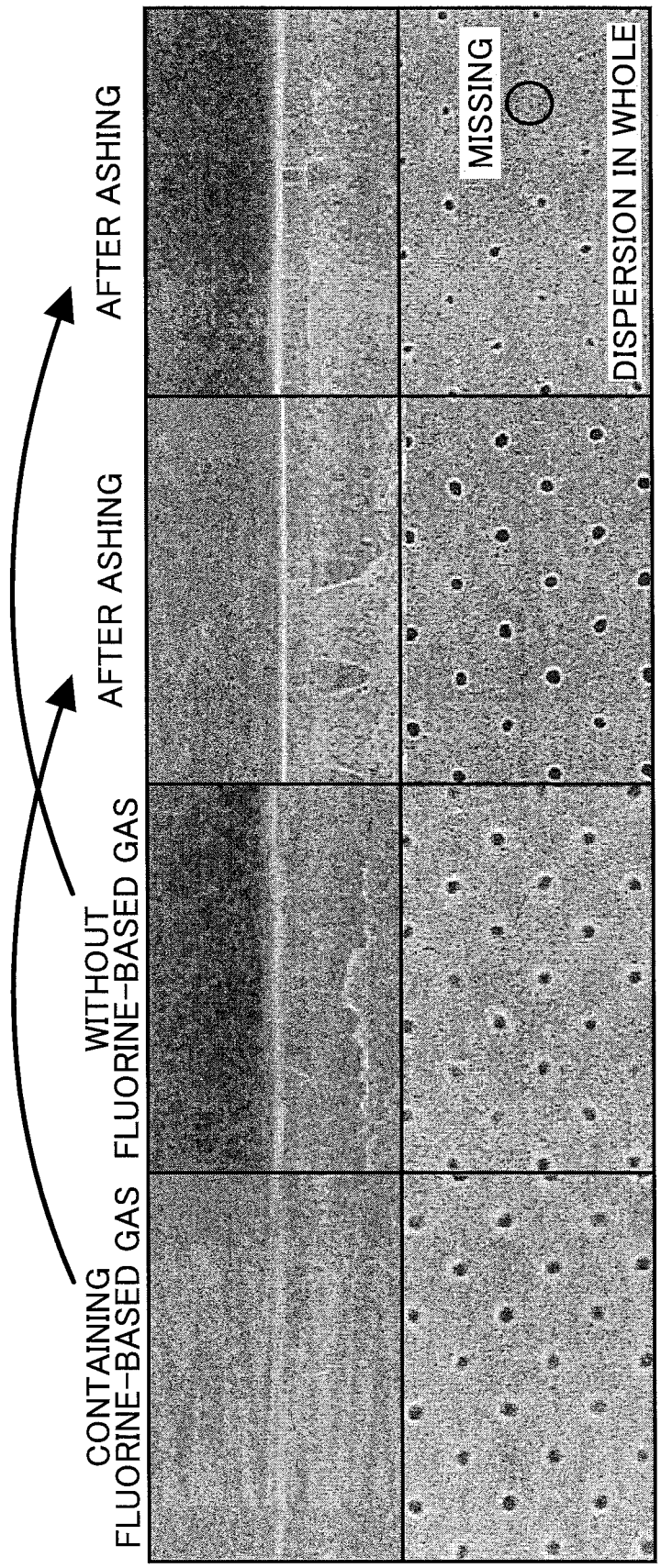
FIG. 19 is a diagram illustrating gas species dependency in the first and second embodiments.

Furthermore, the fourth gas is preferred to contain a fluorine-based gas. A description is given below of a case in which gas species used in the second film deposition process according to the first and second embodiments contain an F-based gas with reference to FIG. 19. FIG. 19 shows an experimental result of a case in which gas species used in the second film deposition process contain an F-based gas.

A hole shape after ashing is preferable when the F-based gas is added to the gas species used in the second film deposition apparatus, whereas hole shapes after ashing vary in general, and more specifically, the omission of the holes can be seen when the F-based gas is not added. The missing holes are thought to be caused, for example, by attachments to the upper portion of the holes as foreign substances that cover the holes like lids.

The missing holes are thought to be caused from a chemical solution and foreign substances in the apparatus, and to be mainly made of an oxide. As discussed above, it is found that the foreign substance that is difficult to be removed without containing the F-based gas in the gas species in the second film deposition process is present. In other words, the F-based gas is thought to serve to remove the foreign substances by reacting with the foreign substances at the upper portions of the holes during the second film deposition process.

Examining the reasons, it is thought that the guide layer 210 has been altered by the heat treatment during the film deposition of the DSA, and a portion that is easy to be etched is generated in a part of the guide layer 210 in the first place. Moreover, when a part of the PMMA 230 is etched by an $O_2$/Ar gas that is the first gas, sometimes the Si-Arc layer 240 is also etched. In such a state, when the F-based gas is contained in the gas for film deposition during the second film deposition process, an oxide mixed into the guide layer 210 in the above process reacts with the F-based gas and is etched, by which the missing holes are removed.

[Gas Species Dependency/F-Based Gas Exchange]

Figure 20:
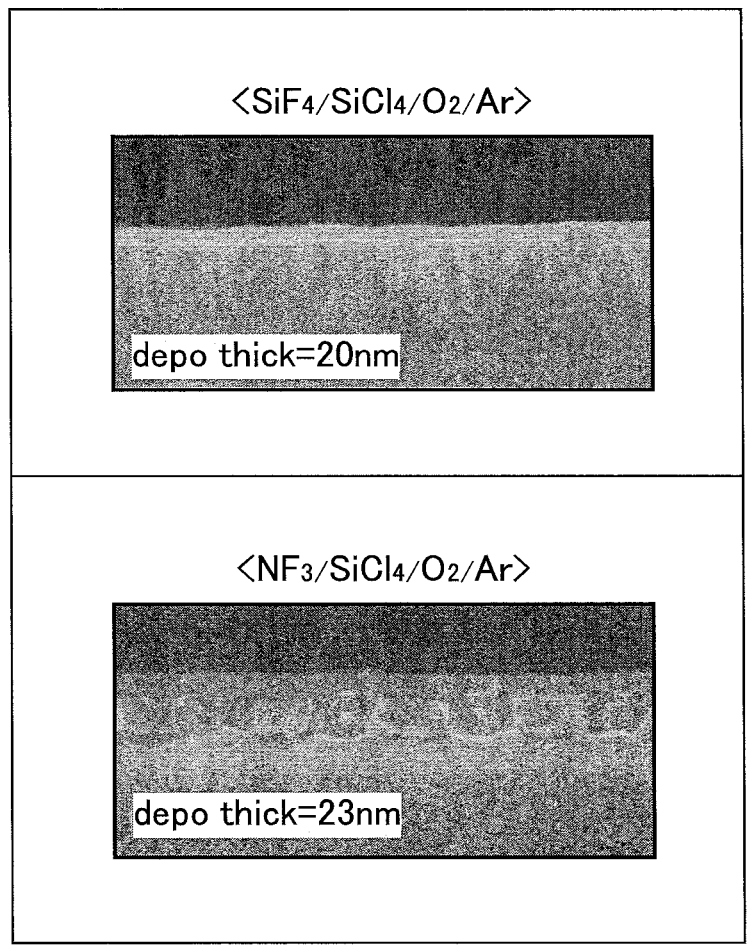
FIG. 20 is a diagram illustrating gas species dependency in the first and second embodiments.

Furthermore, FIG. 20 shows an experimental result when the gas species used in the second film deposition process contain a F-based gas. Process conditions are as follows.
A case of <$SiF_4$/$SiCl_4$/$O_2$/Ar> shown on the upper portion of FIG. 20
Pressure: 10 (mTorr) (=1333.22 Pa)
High Frequency Power: HF for Plasma Generation 500 (W)/LF for Bias 0 (W)
Fourth Gas: $SiF_4$/$SiCl_4$/$O_2$/Ar=5/20/25/200 (sccm)
Process Time: 10 (seconds)
A case of <$NF_3$/$SiCl_4$/$O_2$/Ar> on the lower portion of FIG. 20
Pressure: 10 (mTorr) (=1333.22 Pa)
High Frequency Power: HF for Plasma Generation 500 (W)/LF for Bias 0 (W)
Fourth Gas: $NF_3$/$SiCl_4$/$O_2$/Ar=6/20/25/200 (sccm)
Process Time: 10 (seconds)

FIG. 20 shows that a preferable second protective film is deposited in either case of the upper portion of FIG. 20 or the lower portion of FIG. 20. Hence, the $NF_3$ gas can be used as the gas species used in the second film deposition process instead of the $SiF_4$ gas.

Figure 21:
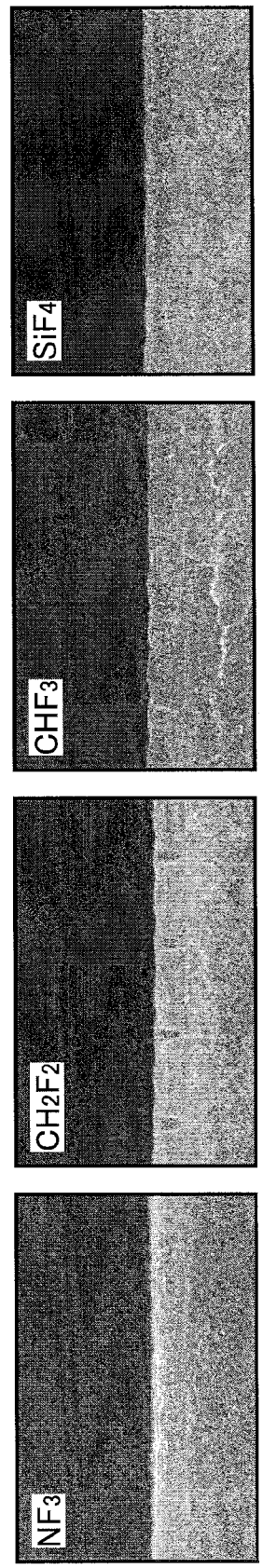
FIG. 21 is a diagram illustrating gas species dependency in the first and second embodiments.

In addition, FIG. 21 shows other experimental results when the gas species used in the second film deposition process contain an F-based gas. According to this, even when an $NF_3$ gas, a $CH_2F_2$ gas and $CHF_3$ gas are used instead of the $SiF_4$ gas, a preferable second film is deposited in each case.

[Circularity of Hole]

Figure 22:
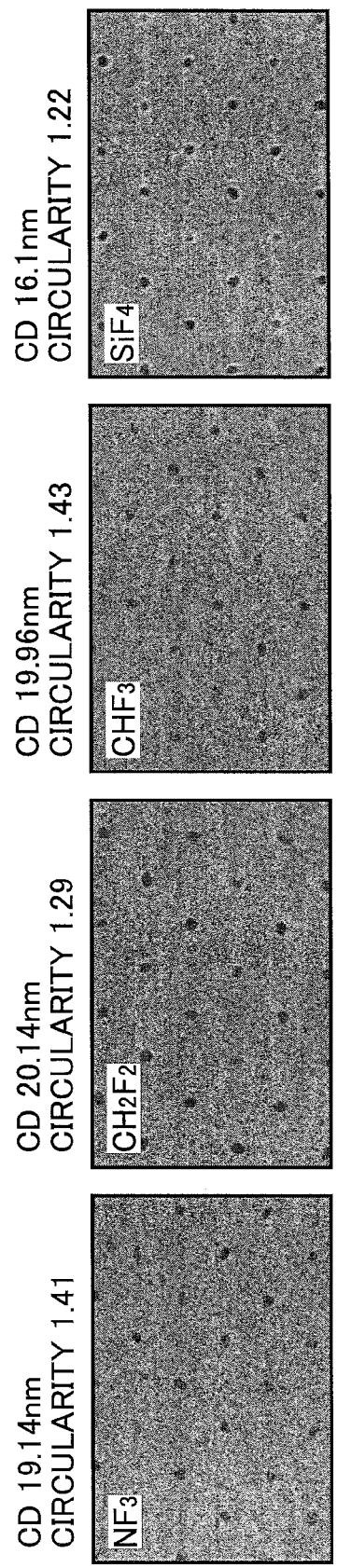
FIG. 22 is a diagram illustrating circularity of a hole formed in the first and second embodiments.

Next, a description is given below of the circularity of the holes with reference to FIG. 22. FIG. 22 shows the circularity of the holes formed in the first and second embodiments. The circularity of the hole means a difference between the maximum diameter and the minimum diameter measured at any cross section of the hole. The circularity of the holes being small shows that the holes do not have variation and have a preferable shape.

According to the experimental results of FIG. 22, when the fourth gas in the second film deposition process contained $NF_3$ gas as the F-based gas, a CD was 19.14 nm, and the circularity was 1.41. When the fourth gas in the second film deposition process contained $CH_2F_2$ gas as the F-based gas, the CD was 20.14 nm, and the circularity was 1.29. When the fourth gas contained $CHF_3$ gas, the CD was 19.96 nm, and the circularity was 1.43, and when the fourth gas contained the $SiF_4$ gas, the CD was 16.1 nm, and the circularity was 1.22. As a result, it is found in all cases that the circularity became high and the hole shapes were preferable when an F-based gas was used.

[Material of Organic Polymer]

Finally, a description is given below of materials that include two kinds of organic polymers (organic films A and B). The first polymer and the second polymer of a block copolymer capable of self-assembly are two kinds of organic polymers.

In the first copolymer and the second copolymer of the block copolymer, a pattern constituted of the first polymer is formed by removing the second polymer by etching. The first polymer and the second polymer are not limited to polystyrene (PS) and methyl methacrylate (PMMA) as described in the embodiments. For example, PS-b-PMMA, which is a diblock copolymer of PS and PMMA, another chain block copolymer, and a block copolymer having another structure such as a star block copolymer, a branched copolymer, a hyper branched block copolymer and a graft copolymer, can be used as the DSA.

The block copolymer can be derived from a variety of different monomers capable of polymerizing, and here, the block copolymer can include a polyolefin containing a polydiene, a polyether containing a polyalkylene oxide (e.g., poly(ethylene oxide), polypropyleneoxide, poly(buthylene oxide), random or block copolymer thereof or the like), a poly methyl methacrylate, a polystyrene, a polyester, a polyorganosiloxane, a polyorganogermane and the like although the block copolymer is not limited thereto.

The block of the block copolymer can include a $C_{2-30}$ olefin monomer, a methacrylate monomer derived from a $C_{1-30}$ alcohol, an inorganic compound containing monomer containing Fe, Si, Ge, Sn or Al based material, or a combination containing at least one of the above monomer as the monomer. The monomer used in the block can contain ethylene, propylene, 1-butene, 1-3 butadiene, isoprene, vinyl acetate, dihydropyran, norbornene, maleic anhydride, styrene, 4-hydroxystyrene, 4-acetoxystyrene, 4-methylstyrene, or α-methylstyrene as the $C_{2-30}$ olefin monomer. The monomer can include methyl methacrylate, ethyl methacrylate, n-propyl methacrylate, isopropyl methacrylate, n-butyl methacrylate, isobutyl methacrylate, n-pentyl methacrylate, isopentyl methacrylate, neopentyl methacrylate, n-hexyl methacrylate, cyclohexyl methacrylate, isobornyl methacrylate, or hydroxyethyl methacrylate as the methacrylate monomer. A combination of two or more of these monomers can be used. The block that is a homopolymer can include a block prepared by using methacrylate homopolymers and a block such as a styrene (e.g., polystyrene block) or polymethyl methacrylate. The random block can include, for example, a block of styrene and methyl methacrylate copolymerized at random (e.g., poly(styrene-co-methyl methacrylate)). An alternative copolymer block can include a block of styrene and maleic anhydride, which is known to form a two-molecule repeated structure of styrene-maleic anhydride (e.g., poly(styrene-alt-maleic anhydride) because the maleic anhydride cannot be made a polymer under almost all conditions. It should be understood that such blocks are only illustrative, and are not limited thereto.

Furthermore, the block copolymer that can be appropriate to be used in the method of the embodiments of the present invention includes a diblock or triblock copolymer such as a combination or the like including at least one of, for example, poly(styrene-b-vnylprydine), poly(styrene-b-butadiene), poly(styrene-b-isoprene), poly(styrene-b-methyl methacrylate), poly(styrene-b-alkenyl aromatic series), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl(metha)acrylate), poly (methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), or the above-mentioned block copolymer.

The block copolymer is preferred to have a total molecular weight that can be further processed and polydispersity. For example, the block copolymer can have a weight-average molecular weight ($M_w$) of 3,000 to 400,000 g/mol. Similarly, the block copolymer can have a number average molecular weight ($M_n$) of 1,000 to 200,000. The block copolymer can also have the polydispersity of 1.01 to 6 ($M_w/M_n$), but is not limited thereto. Molecular weights of both of the $M_w$ and $M_n$ can be determined by using, for example, a universal calibration method calibrated based on the polystyrene standard by gel permeation chromatograph.

As discussed above, according to the method of etching described in the first and second embodiments, a preferable pattern shape can be formed by etching a periodic pattern while depositing a protective film by using a block copolymer capable of self-assembly. In particular, according to the method of etching of the embodiments, the protective film is deposited by introducing a second gas into a chamber in which a pressure is controlled to be 10 to 50 mTorr (=1333.22 to 6666.1 Pa) and by generating plasma from the second gas in a first film deposition process. This enables the first protective film to be deposited only on a top surface of a guide layer 210 and a PS 220 but not to be deposited in a depression formed in the top of a PMMA 230. This makes the first protective film to enhance a selective ratio of the PMMA 230 to the guide layer 210. This allows an ArF photoresist film having a wavelength of 193 nm to be used as a guide, and the periodic pattern can be etched preferably by using the block copolymer capable of self-assembly. This makes it possible to use the versatile ArF photoresist, which can reduce costs.

Although illustrative embodiments of a method and an apparatus for forming a periodic pattern using a self-assembled block copolymer according to the present invention have been described above with reference to the accompanying drawings, the present invention is not limited to these embodiments. The present invention includes all such variations and modifications that may be made without departing from the scope of the present invention.

For example, in the above embodiments, although the etching process is performed by citing an example of forming a hole, the embodiments of the present invention is not limited to this, and for example, the etching process can be performed to foam a line and space pattern.

Moreover, the guide layer is not limited to the ArF photoresist film (193PR) having a wavelength of 193 nm, a KrF photoresist film (248PR) having a wavelength of 248 nm may be used.

Furthermore, in the above embodiments, although the description is given by taking an example of using the resist film as the guide layer, the embodiments of the present invention are not limited to this, and for example, can be applied to a case of using an oxide film and the like as the guide layer.

In addition, in the embodiments, although the description is given by taking an example of using the Si-Arc film as the underlayer film of the guide layer, the embodiments of the present invention can be applied to a case of using a SiON film and the like instead of the Si-Arc layer. In other words, the embodiments of the present invention can be applied to a case of using a Si-containing film as the underlayer film of the guide layer. Here, the Si-Arc film functions as an antireflection film among the Si-containing film, whereas the SiON film functions as a mask of the underlayer.

Moreover, the apparatus that can implement the method for etching according to the embodiments of the present invention is not limited to the lower-part-double-frequency and upper-part-single-frequency application type capacitively-coupled plasma etching apparatus. For example, a lower-part-single-frequency or lower-part-double-frequency or more application type capacitively-coupled plasma etching apparatus can be used.

In the first deposition process, the second gas may be introduce into the chamber in which the pressure is controlled to be 10 to 50 mTorr (=1333.22 to 6666.1 Pa).

A third etching process of etching the underlayer film by plasma generated from a third gas after the second etching process, and a second film deposition process of depositing a second protective film on the surface of the first polymer and the guide layer by plasma generated from a fourth gas before or in the middle of the third etching process, may be further provided.

In the second film deposition process, the second protective film may be deposited a plurality of times in the middle of the third etching process.

In the first film deposition process, after the second polymer is etched up to a depth of 20 nm or deeper in the first etching process, the first protective film may be deposited.

In the first film deposition process, after the second polymer is etched up to the depth of 80 nm or deeper in the first etching process, the first protective film may be deposited.

A fourth etching process of etching the first polymer formed between the second polymer and the underlayer film by plasma generated from a fifth gas after the second etching process may be further provided.

The second gas may contain any of a $SiCl_4$ gas, a $SiF_4$ gas, an $NF_3$ gas, a $CH_2F_2$ gas or a $CHF_3$ gas, either a He gas or Ar gas, and an $O_2$ gas.

The fourth gas may contain a fluorine-based gas.

The fourth gas may contain either a $SiCl_4$ gas or a $CH_3F$ gas.

The first gas may contain an $O_2$ gas and an Ar gas.

The first polymer is polystyrene (PS); the second polymer is methyl methacrylate; and a pattern by the polystyrene may be formed by removing the methyl methacrylate by the etching.

The underlayer film may be a Si-containing film.

The present application is based on and claims the benefit of priority of Japanese Patent Application No. 2012-074540 filed on Mar. 28, 2012, and U.S. Provisional Application No. 61/620,513 filed on Apr. 5, 2012, the entire contents of which are herein incorporated by reference.

DESCRIPTION OF THE REFERENCE NUMERALS 1 plasma processing apparatus
10 chamber
16 susceptor
36 first high frequency power source
48 upper electrode
60 gas supply source
66 third high frequency power source
88 control unit
210 guide layer
220 polystyrene (PS)
230 methyl methacrylate (PMMA)

240 Si-Arc layer
250 carbon layer
260 silicon (Si) substrate
270 first protective film
280 second protective film

The invention claimed is:

1. A method for causing a first polymer and a second polymer of a block copolymer to be self-assembled on an underlayer film and forming a periodic pattern in a guide layer, comprising steps of:
   etching the second polymer by plasma generated from a first gas;
   depositing a first protective film on surfaces of the first polymer and the guide layer except for an etched portion of the second polymer by plasma generated from a second gas after the step of etching the second polymer; and
   further etching the second polymer by the plasma generated from the first gas after the step of depositing the first protective film.

2. The method as claimed in claim 1, wherein the second gas is introduce into a chamber in which a pressure is controlled to be 10 to 50 mTorr (=1333.22 to 6666.1 Pa) in the step of depositing the first protective film.

3. The method as claimed in claim 1, further comprising steps of:
   etching the underlayer film by plasma generated from a third gas after the step of further etching the second polymer; and
   depositing a second protective film on the surfaces of the first polymer and the guide layer from plasma generated from a fourth gas before or in the middle of the step of etching the underlayer film.

4. The method as claimed in claim 3, wherein the second protective film is deposited a plurality of number of times in the middle of the step of etching the underlayer film.

5. The method as claimed in claim 1, wherein the first protective film is deposited in the step of depositing the first protective film after the second polymer is etched up to a depth of 20 nm or deeper in the step of etching the second polymer.

6. The method as claimed in claim 5, wherein the first protective film is deposited in the step of depositing the first protective film after the second polymer is etched up to a depth of 80 nm or deeper in the step of etching the second polymer.

7. The method as claimed in claim 1, further comprising a step of:
   etching the first polymer formed between the second polymer and the underlayer film by plasma generated from a fifth gas after the step of further etching the second polymer.

8. The method as claimed in claim 1, wherein the second gas contains any of a $SiCl_4$ gas, a $SiF_4$ gas, a $NF_3$ gas, a $CH_2F_2$ gas or a $CHF_3$ gas, either a He gas or an Ar gas, and an $O_2$ gas.

9. The method as claimed in claim 3, wherein the fourth gas contains a fluorine-based gas.

10. The method as claimed in claim 9, wherein the fourth gas contains either a $SiCl_4$ gas or a $CH_3F$ gas.

11. The method as claimed in claim 1, wherein the first gas contains an $O_2$ gas and an Ar gas.

12. The method as claimed in claim 1,
    wherein the first polymer is polystyrene, and the second polymer is methyl methacrylate, and
    wherein the periodic pattern constituted by the polystyrene is formed by removing the methyl methacrylate by the etching.

13. The method as claimed in claim 1, wherein the underlayer film is a Si-containing film.

* * * * *